US012249677B2

(12) United States Patent
Matsushima et al.

(10) Patent No.: US 12,249,677 B2
(45) Date of Patent: Mar. 11, 2025

(54) ULTRAVIOLET LIGHT EMITTING DEVICE

(71) Applicant: TOYODA GOSEI CO., LTD., Kiyosu (JP)

(72) Inventors: Takeshi Matsushima, Kiyosu (JP); Shota Shimonishi, Kiyosu (JP); Kenichi Matsuura, Kiyosu (JP); Aya Kawaoka, Kiyosu (JP); Takashi Shugo, Kiyosu (JP); Shintaro Hakamata, Kiyosu (JP); Yuki Goto, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 436 days.

(21) Appl. No.: 17/573,142

(22) Filed: Jan. 11, 2022

(65) Prior Publication Data

US 2022/0223767 A1    Jul. 14, 2022

(30) Foreign Application Priority Data

Jan. 13, 2021   (JP) .................................. 2021-003828

(51) Int. Cl.
    *H01L 33/56*    (2010.01)
    *H01L 33/32*    (2010.01)
    (Continued)

(52) U.S. Cl.
    CPC ............ *H01L 33/56* (2013.01); *H01L 33/382* (2013.01); *H01L 33/486* (2013.01)

(58) Field of Classification Search
    CPC . H01L 33/56; H01L 2933/005; H01L 33/486; H01L 33/62; H01L 33/382;
    (Continued)

(56) References Cited

U.S. PATENT DOCUMENTS

2007/0267645 A1* 11/2007 Nakata ................... H01L 33/58
                                                      257/E33.059
2020/0064647 A1    2/2020 Saneto et al.
                    (Continued)

FOREIGN PATENT DOCUMENTS

CN        100555694 C      10/2009
CN        108134007 A       6/2018
                   (Continued)

OTHER PUBLICATIONS

Japanese Office Action dated Sep. 19, 2023, in corresponding Japanese Patent Application No. 2021-003828, with an English translation thereof.
(Continued)

*Primary Examiner* — Sonya McCall-Shepard
(74) *Attorney, Agent, or Firm* — MCGINN I.P. LAW GROUP, PLLC

(57) ABSTRACT

The bonding layer bonds the electrode on the first surface of the ultraviolet light emitting element and a part of the mounting surface of the substrate. The adhesive layer adheres the substrate to the light transmitting member. The substrate and the light transmitting member are disposed in a state where the ultraviolet light emitting element is sandwiched therebetween. The fluorocarbon compound is a liquid at normal temperature and pressure. The fluorocarbon compound fills a gap between the second surface of the ultraviolet light emitting element and the light transmitting member in a state of being in contact with the second surface and the light transmitting member. The fluorocarbon compound is in contact with the side surface of the ultraviolet light emitting element. The fluorocarbon compound is not in contact with the adhesive layer.

19 Claims, 18 Drawing Sheets

(51) Int. Cl.
  *H01L 33/38*    (2010.01)
  *H01L 33/48*    (2010.01)
  *H01L 33/58*    (2010.01)
  *H01L 33/62*    (2010.01)

(58) Field of Classification Search
  CPC ......... H01L 33/58; H01L 33/48; H01L 33/54; H01L 33/505; H01L 2933/0041; H01L 33/501; H01L 33/60
  See application file for complete search history.

(56) References Cited

U.S. PATENT DOCUMENTS

| | | |
|---|---|---|
| 2021/0091277 A1 | 3/2021 | Shi et al. |
| 2021/0111318 A1* | 4/2021 | Lin .................. H01L 33/58 |
| 2021/0217936 A1 | 7/2021 | Shi et al. |
| 2021/0305471 A1 | 9/2021 | Shi et al. |

FOREIGN PATENT DOCUMENTS

| | | |
|---|---|---|
| JP | UMS60-049510 A | 4/1985 |
| JP | 2007-311707 A | 11/2007 |
| JP | 2008-112908 A | 5/2008 |
| JP | 2014-102388 A | 6/2014 |
| JP | 2015-079924 A | 4/2015 |
| JP | 2016-207754 A | 12/2016 |
| JP | 2017-017110 A | 1/2017 |
| JP | 2017-162997 A | 9/2017 |
| JP | 2018-212350 A1 | 11/2018 |
| JP | 2019186333 A * | 10/2019 |
| JP | 2020-131127 A | 8/2020 |
| WO | WO 2020-102948 A1 | 5/2020 |

OTHER PUBLICATIONS

Japanese Office Action 2024-034803 issued on Oct. 22, 2024 with English translation thereof.

* cited by examiner

ULTRAVIOLET LIGHT EMITTING DEVICE

CROSS-REFERENCE TO RELATED APPLICATIONS

This application is based on and claims priority under 35 USC 119 from Japanese Patent Application No. 2021-003828 filed on Jan. 13, 2021.

TECHNICAL FIELD

The technical field of the present specification relates to an ultraviolet light emitting device including an ultraviolet light emitting element.

BACKGROUND ART

In a light emitting device which emits visible light, a semiconductor light emitting element mounted on a substrate is sealed with a resin. The sealing resin is, for example, a silicone resin or an epoxy resin. Refractive index of these resins are greater than a refractive index of the atmosphere. Therefore, reflection at an interface between the semiconductor light emitting element and the sealing resin is prevented. That is, light extraction efficiency is high.

In recent years, a light emitting device including an ultraviolet light emitting element has been researched and developed. Ultraviolet light modifies the silicone resin and the epoxy resin. Accordingly, cracks may occur in the sealing resin. Therefore, a light emitting device in which a periphery of an ultraviolet light emitting element is not sealed with a resin has been developed. The ultraviolet light emitting element has a refractive index of about 1.7, which is greatly different from the refractive index of the atmosphere. Therefore, total reflection is likely to occur at an interface between the ultraviolet light emitting element and the atmosphere. That is, light extraction efficiency of such an air emitting type light emitting device tends to be low.

On the other hand, there is a technique sealing a light emitting device including an ultraviolet light emitting element. For example, JP-A-2016-207754 discloses a technique of sealing with a liquid organic halide (paragraphs [0042] to [0044] in JP-A-2016-207754). However, the liquid is less likely to be deteriorated by ultraviolet light, and may react with an adhesive. In this case, a substrate and a lens or the like may be separated from each other. In addition, the liquid may leak from a slight gap of the adhesive.

Therefore, it is preferable to prevent peeling between the substrate and the lens or the like. In addition, it is preferable to prevent leakage of the liquid. Of course, it is preferable that an output of the light emitting device is high.

SUMMARY OF INVENTION

An object of the present specification is to provide an ultraviolet light emitting device having a high output and capable of preventing peeling between a substrate and a lens or the like.

An ultraviolet light emitting device according to a first aspect includes a substrate, an ultraviolet light emitting element, a bonding layer, a light transmitting member, an adhesive layer, and a fluorocarbon compound. The substrate has a mounting surface mounting the ultraviolet light emitting element. The ultraviolet light emitting element has a first surface having an electrode, a second surface opposite to the first surface, and a side surface. The bonding layer bonds the electrode on the first surface of the ultraviolet light emitting element and a part of the mounting surface of the substrate. The light transmitting member is configured to transmit ultraviolet light. The adhesive layer adheres the substrate to the light transmitting member. The substrate and the light transmitting member are disposed in a state where the ultraviolet light emitting element is sandwiched therebetween. The fluorocarbon compound is a liquid at normal temperature and pressure. The fluorocarbon compound fills a gap between the second surface of the ultraviolet light emitting element and the light transmitting member in a state of being in contact with the second surface and the light transmitting member. The fluorocarbon compound is in contact with the side surface of the ultraviolet light emitting element. The fluorocarbon compound is not in contact with the adhesive layer.

In the ultraviolet light emitting device, light extraction efficiency from the ultraviolet light emitting element is high. In addition, there is almost no possibility that the adhesive layer adhering the substrate to the light transmitting member is adversely affected by the fluorocarbon compound. Therefore, the ultraviolet light emitting device has a high output. In addition, peeling between the substrate and the light transmitting member is less likely to occur.

In the present specification, it is possible to provide an ultraviolet light emitting device having a high output and capable of preventing peeling between the substrate and the lens or the like.

DESCRIPTION OF EMBODIMENTS

Hereinafter, specific embodiments will be described with reference to the drawings, taking an ultraviolet light emitting device as an example. However, the technique of the present specification is not limited to the embodiments. A structure different from that of the embodiment may be included. The thickness ratio of each layer in each figure is conceptually illustrated, and does not indicate the actual thickness ratio.

First Embodiment

1. Light Emitting Device

Figure 1:
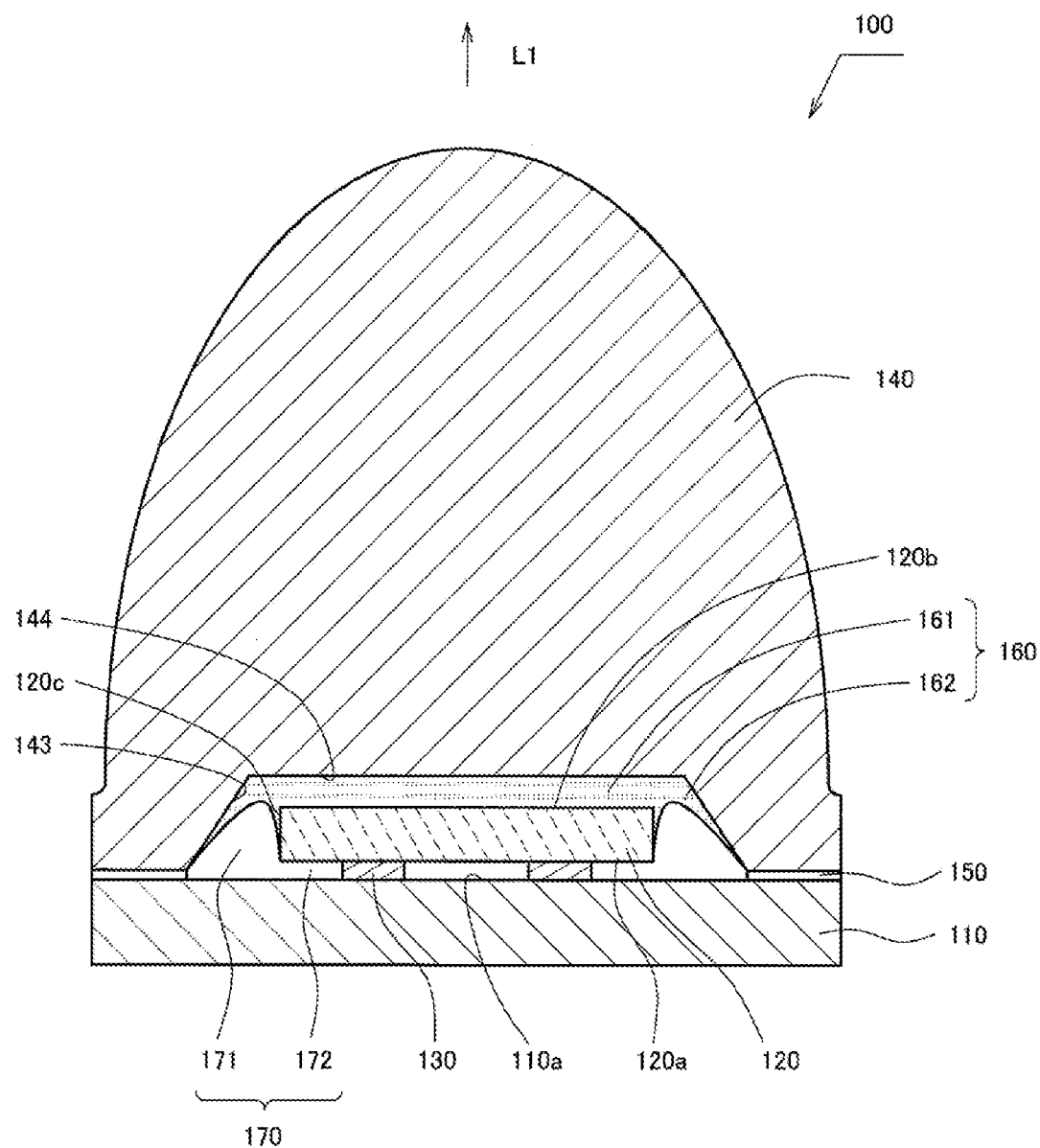
FIG. 1 is a schematic configuration diagram of a light emitting device 100 according to a first embodiment.

FIG. 1 is a schematic configuration diagram of a light emitting device 100 according to a first embodiment. As illustrated in FIG. 1, the light emitting device 100 includes a substrate 110, an ultraviolet light emitting element 120, a bonding layer 130, a lens 140, an adhesive layer 150, a fluorocarbon compound 160, and an air layer 170. The light emitting device 100 is an ultraviolet light emitting device which emits ultraviolet light.

The substrate 110 is a substrate for mounting the ultraviolet light emitting element 120. The substrate 110 has a mounting surface 110a. The mounting surface 110a is a surface for mounting the ultraviolet light emitting element 120. The mounting surface 110a is a surface of a circuit pattern.

The ultraviolet light emitting element 120 is a semiconductor light emitting element which emits ultraviolet light. An emission wavelength of the ultraviolet light emitting element 120 is, for example, 200 nm or more and 320 nm or less. The ultraviolet light emitting element 120 is mounted on the substrate 110 via the bonding layer 130. The ultraviolet light emitting element 120 has a first surface 120a, a second surface 120b, and a side surface 120c. The first surface 120a has an electrode thereon. The first surface 120a faces the mounting surface 110a of the substrate 110. The second surface 120b is a surface opposite to the first surface 120a. The second surface 120b is a light extraction surface which extracts light to the outside of the ultraviolet light emitting element 120. The second surface 120b faces the lens 140. The side surface 120c is a surface other than the first surface 120a and the second surface 120b.

The bonding layer 130 is a layer for mounting the ultraviolet light emitting element 120 on the substrate 110. The bonding layer 130 bonds the electrode on the first surface 120a of the ultraviolet light emitting element 120 and the circuit pattern of the mounting surface 110a of the substrate 110. The material of the bonding layer 130 is, for example, an Au—Sn solder.

The lens 140 is a light transmitting member for suitably extracting ultraviolet light emitted from the ultraviolet light emitting element 120 to the outside. Of course, the lens 140 transmits ultraviolet light. The lens 140 is made of, for example, quartz glass. The lens 140 is has a refractive index larger than the refractive index of the atmosphere. The refractive index of the lens 140 is, for example, 1.2 or more and 1.6 or less.

Figure 2:
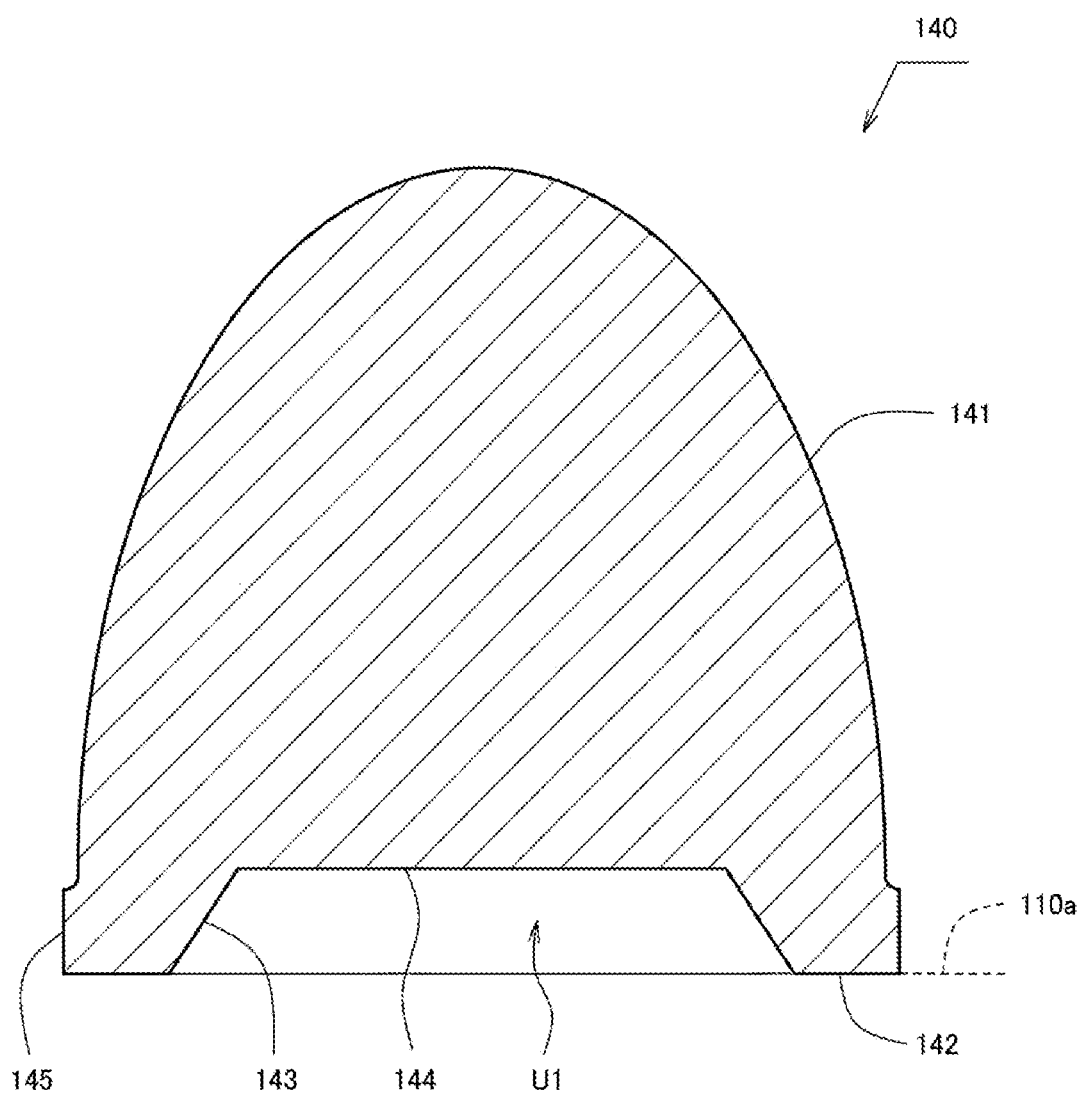
FIG. 2 is a cross-sectional view illustrating a lens 140 of the light emitting device 100 according to the first embodiment.

FIG. 2 is a cross-sectional view illustrating the lens 140 of the light emitting device 100 according to the first embodiment. As illustrated in FIG. 2, the lens 140 includes a convex surface 141, a flat surface 142, an inner wall 143, a ceiling surface 144, and a base portion 145. The lens 140 includes a concave portion U1 on a mounting surface 110a side of the substrate 110. The concave portion U1 has the inner wall 143 and the ceiling surface 144. The convex surface 141 faces the outside of the light emitting device 100. The convex surface 141 has a rotary paraboloid. In addition, the light emitting device 100 emits ultraviolet light from the convex surface 141 (see an arrow L1 in FIG. 1). The flat surface 142 is an adhesive surface to the substrate 110. The inner wall 143 faces the substrate 110 together with the ceiling surface 144. The inner wall 143 extends toward the substrate 110. The ceiling surface 144 is a surface facing the substrate 110 and the ultraviolet light emitting element 120 after being bonded to the substrate 110. The base portion 145 is a portion located at a base of the lens 140.

Figure 3:
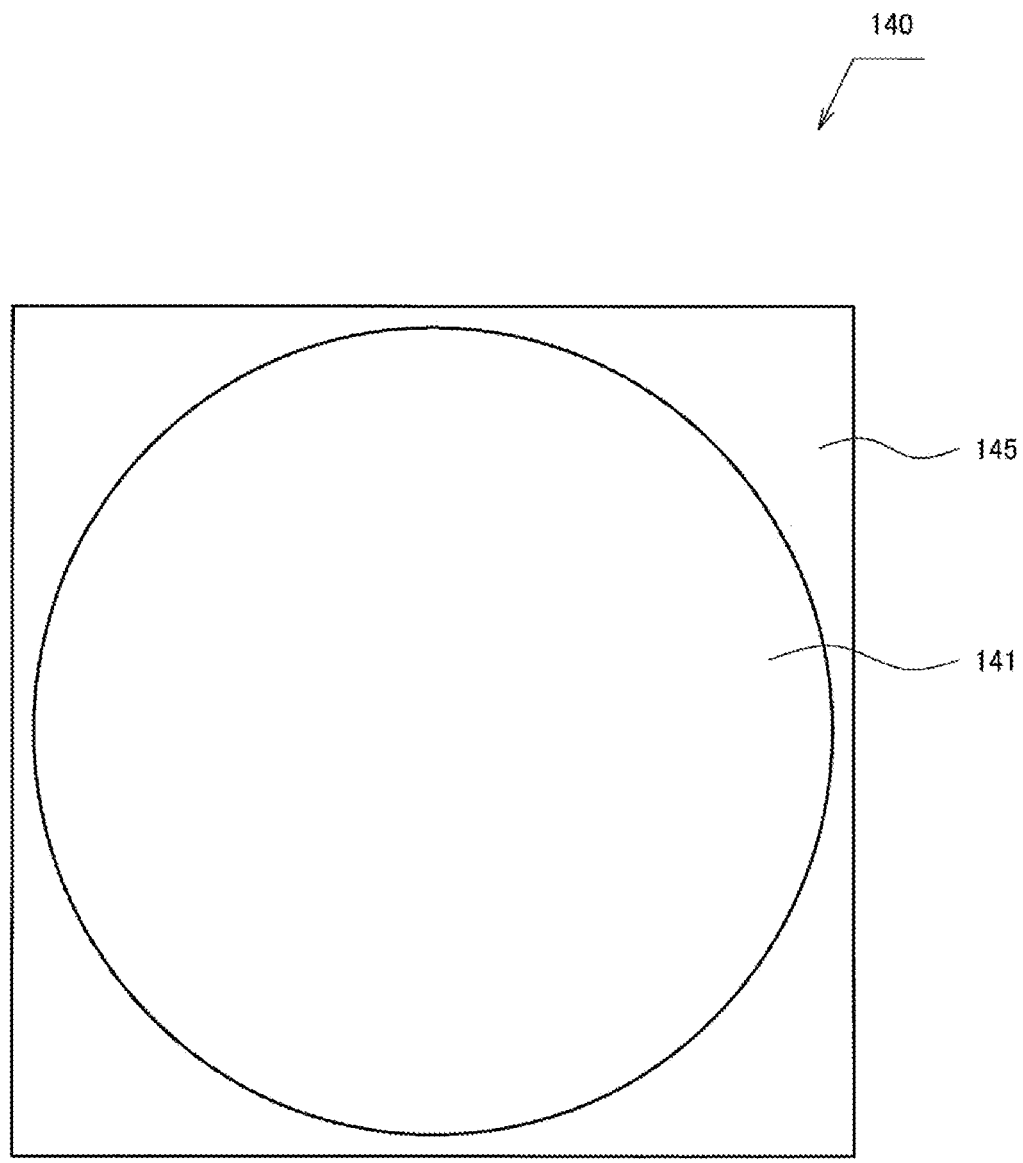
FIG. 3 is a plan view illustrating the lens 140 of the light emitting device 100 according to the first embodiment.

FIG. 3 is a plan view illustrating the lens 140 of the light emitting device 100 according to the first embodiment. As illustrated in FIG. 3, since the convex surface 141 is a rotary paraboloid, the convex surface 141 is circular in the plan view. The base portion 145 is square in the plan view.

The adhesive layer 150 adheres the substrate 110 to the lens 140. The adhesive layer 150 adheres the substrate 110 to the lens 140 in a state where the substrate 110 and the lens 140 sandwich the ultraviolet light emitting element 120 therebetween. Therefore, the substrate 110 and the lens 140 are disposed in a state where the ultraviolet light emitting element 120 is sandwiched between the substrate 110 and the lens 140.

The fluorocarbon compound 160 is located between the ultraviolet light emitting element 120 and the lens 140.

The air layer 170 is a closed space located between the substrate 110 and the lens 140.

2. Fluorocarbon Compound 2-1. Region of Fluorocarbon Compound

The fluorocarbon compound 160 is a polymer having a CF bond. The fluorocarbon compound 160 is a liquid at normal temperature and pressure. The number of carbon atoms in the fluorocarbon compound 160 is 1.9 times or less the number of fluorine atoms in the fluorocarbon compound 160. The fluorocarbon compound 160 is, for example, perfluoropolyether (PFPE). It is sufficient that the refractive index of the fluorocarbon compound 160 is greater than the refractive index of the atmosphere and equal to or less than the refractive index of the ultraviolet light emitting element 120. The refractive index of the fluorocarbon compound 160 is, for example, 1.2 or more and 1.6 or less.

As illustrated in FIG. 1, the fluorocarbon compound 160 fills a gap between the second surface 120b of the ultraviolet light emitting element 120 and the lens 140. Therefore, the fluorocarbon compound 160 is in contact with the second surface 120b of the ultraviolet light emitting element 120 and the lens 140.

Figure 4:
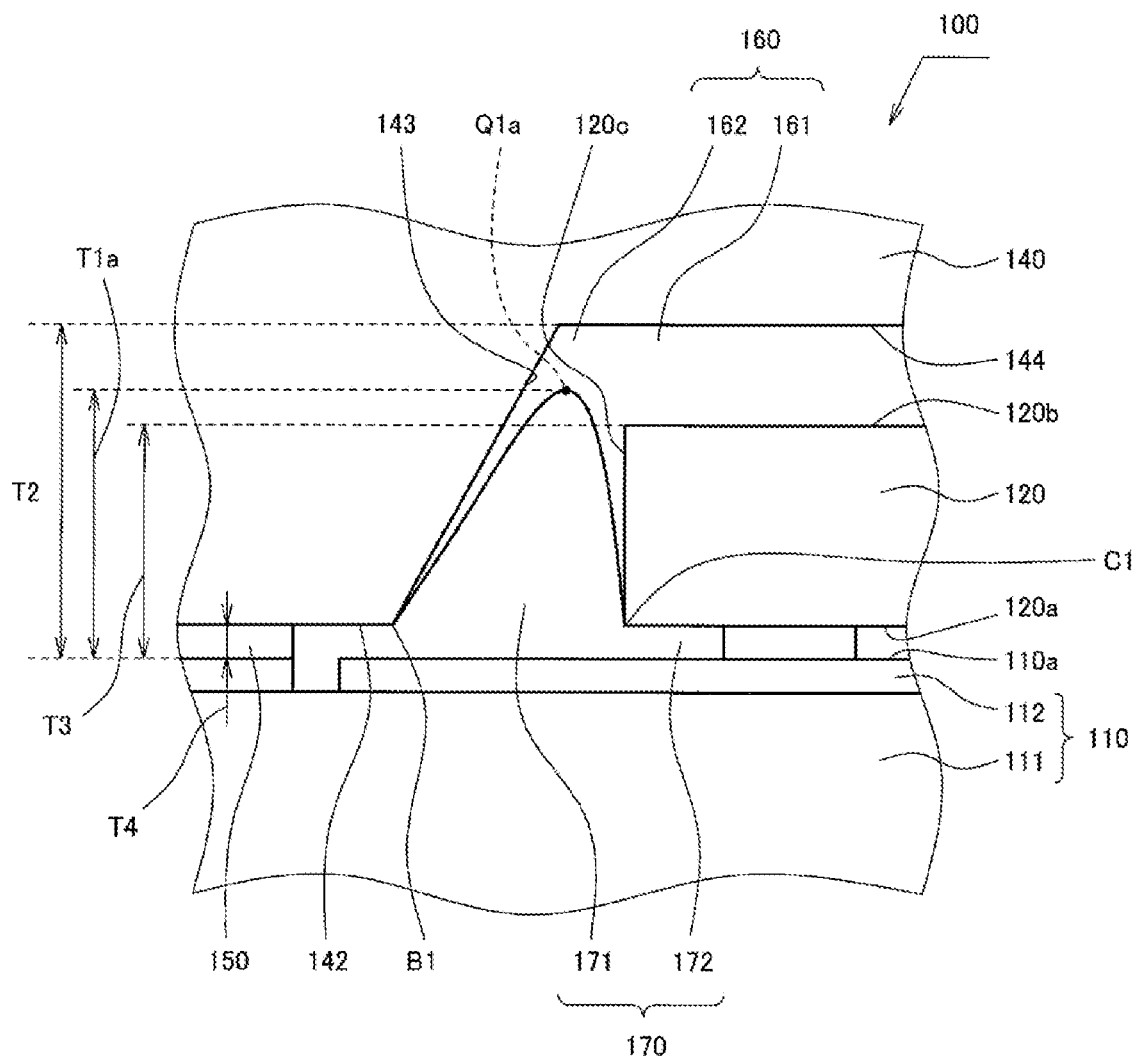
FIG. 4 is diagram illustrating a positional relationship between an air layer 170 and a fluorocarbon compound 160 of the light emitting device 100 according to the first embodiment.

FIG. 4 is diagram illustrating a positional relationship between the air layer 170 and the fluorocarbon compound 160 of the light emitting device 100 according to the first embodiment. As illustrated in FIG. 4, the substrate 110 includes a base material 111 and a circuit pattern 112. The mounting surface 110a is a surface on the circuit pattern 112.

The fluorocarbon compound 160 forms a fillet shape. The fluorocarbon compound 160 is in contact with the side surface 120c of the ultraviolet light emitting element 120 and the inner wall 143 of the lens 140. However, the fluorocarbon compound 160 is not in contact with the mounting surface 110a of the substrate 110.

In addition, the fluorocarbon compound 160 covers the second surface 120b and the side surface 120c of the ultraviolet light emitting element 120, but does not cover the first surface 120a. Therefore, the fluorocarbon compound 160 does not cover the bonding layer 130.

The fluorocarbon compound 160 is not in contact with the adhesive layer 150.

The fluorocarbon compound 160 includes a central portion 161 and an outer edge portion 162. The central portion 161 and the outer edge portion 162 are connected to each other. The central portion 161 is a region sandwiched between the ultraviolet light emitting element 120 and the lens 140. The central portion 161 has a rectangular parallelepiped shape. Vertical and horizontal lengths of the rectangular parallelepiped shape are equal to vertical and horizontal lengths of the ultraviolet light emitting element 120.

The outer edge portion 162 is a region sandwiched between the lens 140 and the air layer 170. The outer edge portion 162 is in contact with the side surface 120c of the ultraviolet light emitting element 120 and the inner wall 143 of the lens 140. Therefore, in a region immediately outside the ultraviolet light emitting element 120, the substrate 110, an annular portion 171 of the air layer 170, the outer edge portion 162 of the fluorocarbon compound 160, and the lens 140 are stacked in this order.

A thickness of the fluorocarbon compound 160 in contact with the side surface 120c of the ultraviolet light emitting element 120 increases as a distance from the mounting surface 110a of the substrate 110 increases.

As illustrated in FIG. 4, a point B1 or a point C1 is located at a position in the fluorocarbon compound 160 closest to the mounting surface 110a of the substrate 110. The point B1 is a point at which the flat surface 142 of the lens 140 and the inner wall 143 intersect each other. The point C1 is a point at which the side surface 120c of the ultraviolet light emitting element 120 and the first surface 120a intersect each other.

That is, a portion of the fluorocarbon compound 160 which is located closest to the mounting surface 110a of the substrate 110 is located at a position along the inner wall 143 of the lens 140 or at a position along the side surface 120c of the ultraviolet light emitting element 120.

Particularly, the portion of the fluorocarbon compound 160 which is located closest to the mounting surface 110a of the substrate 110 is located at a position (point B1) closest to the mounting surface 110a among points on the inner wall 143 of the lens 140, or at a position (point C1) closest to the mounting surface 110a among points on the side surface 120c of the ultraviolet light emitting element 120.

2-2. Effect of Fluorocarbon Compound

The fluorocarbon compound 160 covers the second surface 120b and the side surface 120c of the ultraviolet light emitting element 120. The refractive index of the fluorocarbon compound 160 is greater than the refractive index of the atmosphere and equal to or less than the refractive index of the ultraviolet light emitting element 120. Therefore, the light to be emitted from the second surface 120b and the side surface 120c of the ultraviolet light emitting element 120 is less likely to be totally reflected at a boundary surface with the fluorocarbon compound 160. That is, the light extraction efficiency on the second surface 120b and the side surface 120c of the ultraviolet light emitting element 120 is high.

The fluorocarbon compound 160 does not cover the first surface 120a of the ultraviolet light emitting element 120. Here, the refractive index of the ultraviolet light emitting element 120 is about 1.7, and the refractive index of the atmosphere is about 1. Therefore, the light to be emitted from the first surface 120a of the ultraviolet light emitting element 120 is likely to be totally reflected. If the ultraviolet light emitting element 120 in which ultraviolet light is emitted to some extent also to a first surface 120a side is used, the light to be emitted to the first surface 120a side can be reflected to a second surface 120b side.

3. Air Layer 3-1. Region of Air Layer

The air layer 170 is filled with a gas. The gas is, for example, atmosphere. The air layer 170 is located between the substrate 110 and the lens 140. The air layer 170 is in contact with the fluorocarbon compound 160 and the adhesive layer 150.

The air layer 170 includes an annular portion 171 annularly surrounding a periphery of the ultraviolet light emitting element 120, and a coupling portion 172, which is a gap between the ultraviolet light emitting element 120 and the substrate 110. The annular portion 171 is an annular space based on a quadrangle conforming to the shape of the ultraviolet light emitting element 120. The coupling portion 172 is a gap which couples to the annular portion 171.

The annular portion 171 is located between the mounting surface 110a of the substrate 110 and the outer edge portion 162 of the fluorocarbon compound 160. The annular portion 171 surrounds a periphery of the side surface 120c of the ultraviolet light emitting element 120. The fluorocarbon compound 160 is present between the annular portion 171 and the side surface 120c of the ultraviolet light emitting element 120.

The coupling portion 172 is located between the mounting surface 110a of the substrate 110 and the first surface 120a of the ultraviolet light emitting element 120. Therefore, the first surface 120a of the ultraviolet light emitting element 120 is not in contact with the fluorocarbon compound 160.

As illustrated in FIG. 4, a distance T1a is smaller than a distance T2 and larger than distances T3 and T4. The distance T1a is a distance from a point Q1a in the air layer 170 located farthest from the mounting surface 110a of the substrate 110 to the mounting surface 110a of the substrate 110. The distance T2 is a distance from the ceiling surface 144 of the lens 140 to the mounting surface 110a of the substrate 110. The distance T3 is a distance from the second surface 120b of the ultraviolet light emitting element 120 to the mounting surface 110a of the substrate 110. The distance T4 is a distance from the first surface 120a of the ultraviolet light emitting element 120 to the mounting surface 110a of the substrate 110.

That is, the distance T1a from the point Q1a in the air layer 170 located farthest from the mounting surface 110a of the substrate 110 to the mounting surface 110a of the substrate 110 is smaller than the distance T2 from the ceiling surface 144 of the lens 140 to the mounting surface 110a of the substrate 110. In addition, the distance T1a from the point Q1a in the air layer 170 located farthest from the mounting surface 110a of the substrate 110 to the mounting surface 110a of the substrate 110 is larger than the distance T3 from the second surface 120b of the ultraviolet light emitting element 120 to the mounting surface 110a of the substrate 110.

The point Q1a in the air layer 170 located farthest from the mounting surface 110a of the substrate 110 is located at an outer side of the side surface 120c of the ultraviolet light emitting element 120 and at an inner side of the point B1 at which the flat surface 142 and the inner wall 143 of the lens 140 intersect each other.

In addition, as illustrated in FIG. 4, there is no air layer between the second surface 120b of the ultraviolet light emitting element 120 and the ceiling surface 144 of the lens 140.

Figure 5:
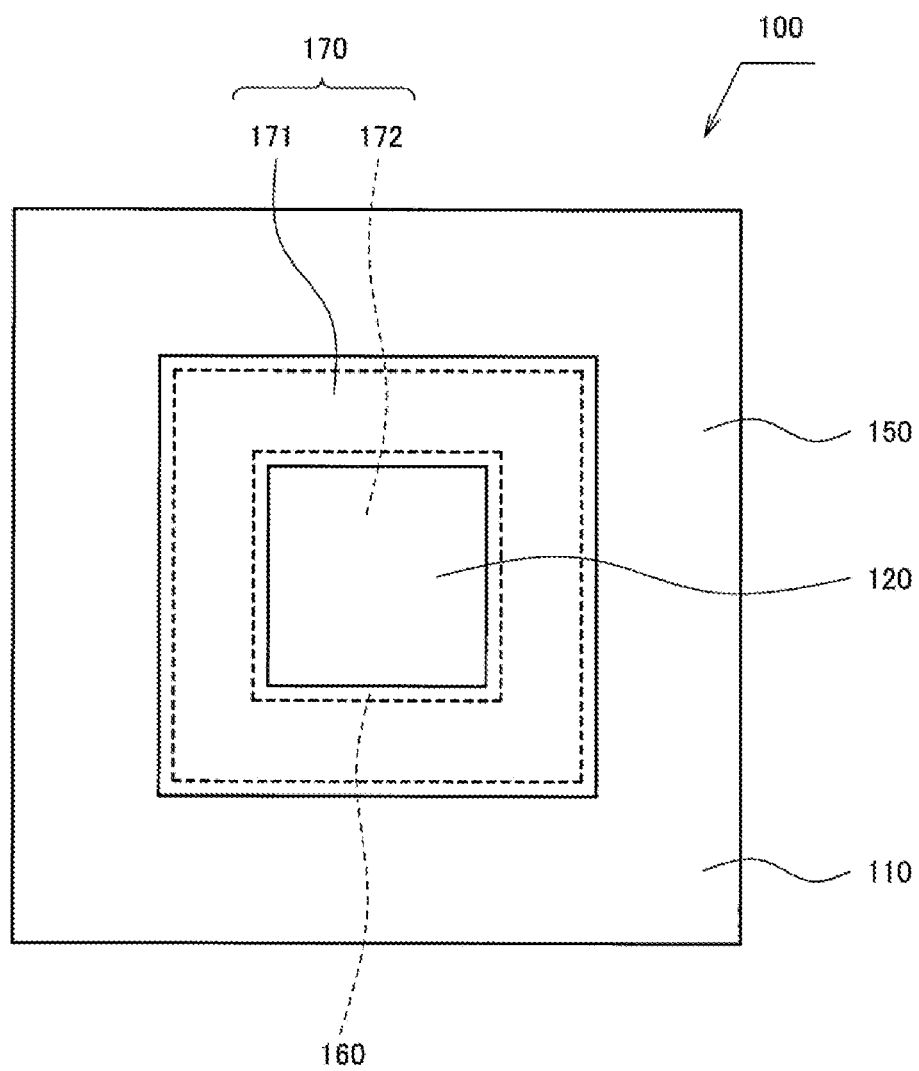
FIG. 5 is diagram illustrating a region of the air layer 170 of the light emitting device 100 according to the first embodiment.

FIG. 5 is diagram illustrating a region of the air layer 170 of the light emitting device 100 according to the first embodiment. In FIG. 5, the fluorocarbon compound 160 around a periphery of the ultraviolet light emitting element 120 is virtually drawn. The air layer 170 surrounds the periphery of the ultraviolet light emitting element 120 with the fluorocarbon compound 160 sandwiched therebetween. An outer edge of the air layer 170 on the side opposite to the ultraviolet light emitting element 120 has a quadrangular shape.

3-2. Effect of Air Layer

When the annular portion 171 of the air layer 170 is present between the outer edge portion 162 of the fluorocarbon compound 160 and the mounting surface 110a of the substrate 110, the fluorocarbon compound 160 is not in contact with the adhesive layer 150. Therefore, there is almost no possibility that the fluorocarbon compound 160 and the adhesive layer 150 react with each other. In addition, since the fluorocarbon compound 160 does not reach the adhesive layer 150, even when there is a slight gap in the adhesive layer 150, there is almost no possibility that the fluorocarbon compound 160 spills out from the gap to the outside of the light emitting device 100.

4. Distance Between Ultraviolet Light Emitting Element and Lens 4-1. Distance

Figure 6:
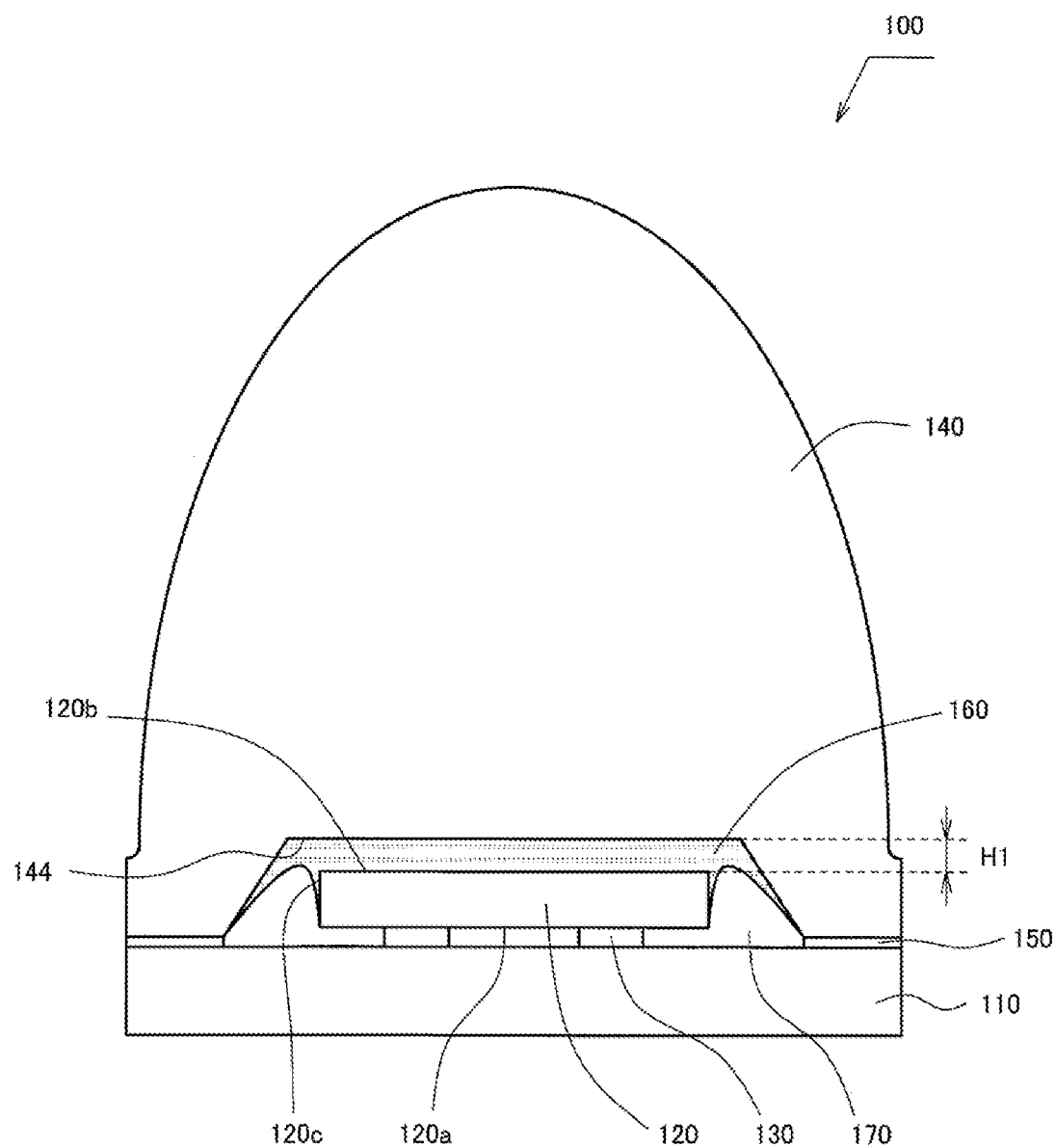
FIG. 6 is diagram illustrating a distance between a second surface 120*b* of an ultraviolet light emitting element 120 and a ceiling surface 144 of a lens 140 in the light emitting device 100 according to the first embodiment.

FIG. 6 is diagram illustrating a distance between the second surface 120b of the ultraviolet light emitting element 120 and the ceiling surface 144 of the lens 140 in the light emitting device 100 according to the first embodiment. The second surface 120b of the ultraviolet light emitting element 120 faces a side of the ultraviolet light emitting element 120 opposite to the substrate 110. As illustrated in FIG. 6, a distance H1 between the second surface 120b of the ultraviolet light emitting element 120 and the ceiling surface 144 of the lens 140 is 0.1 μm or more and 500 μm or less. Preferably, the distance H1 is 0.1 μm or more and 400 μm or less. More preferably, the distance H1 is 0.1 μm or more and 300 μm or less.

4-2. Effect of Distance

The fluorocarbon compound 160 absorbs ultraviolet light to some extent. Therefore, the distance H1 between the second surface 120b of the ultraviolet light emitting element 120 and the ceiling surface 144 of the lens 140 is preferably small. As the distance H1 decreases, the ultraviolet light is not absorbed by the fluorocarbon compound 160, and the light output increases.

5. Refractive Index

The ultraviolet light emitting element 120 has a refractive index of about 1.7. The fluorocarbon compound 160 has a refractive index of about 1.2 or more and 1.6 or less. The lens 140 has a refractive index of about 1.2 or more and 1.6 or less. The atmosphere has a refractive index of 1.

In the first embodiment, the second surface 120b and the side surface 120c of the ultraviolet light emitting element 120 are not in contact with the air layer 170. As described above, the refractive index of the ultraviolet light emitting element 120 is sufficiently greater than the refractive index of the air layer 170. Since in the ultraviolet light emitting element 120, the second surface 120b and the side surface 120c from which the light is extracted to the outside are not in contact with the air layer 170 having a lower refractive index, the light from the ultraviolet light emitting element 120 is likely to be emitted to the outside of the element.

6. Production Method 6-1. Element Mounting Step

Figure 7:
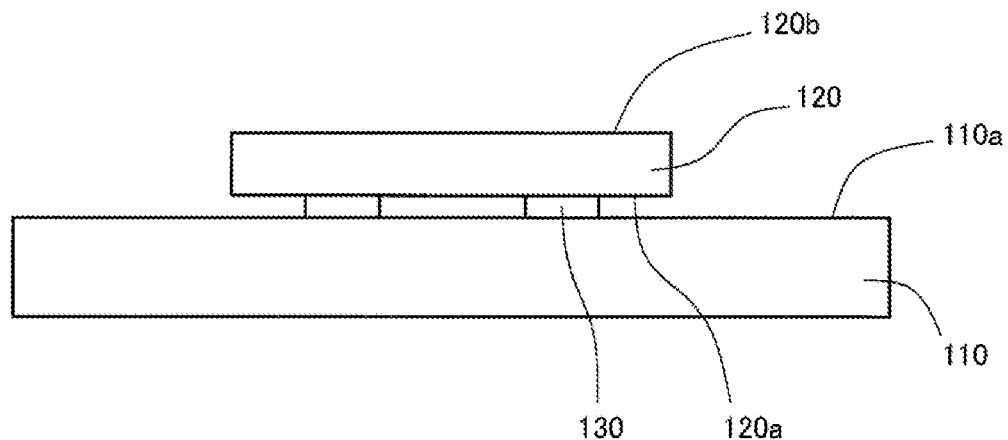
FIG. 7 is a diagram (part 1) illustrating a method for producing the light emitting device 100 according to the first embodiment.

As illustrated in FIG. 7, the ultraviolet light emitting element 120 is mounted on the mounting surface 110a of the substrate 110. A solder is placed on the mounting surface 110a of the substrate 110. The ultraviolet light emitting element 120 is placed on the solder such that the electrode on the first surface 120a of the ultraviolet light emitting element 120 is in contact with the solder. Then, the ultraviolet light emitting element 120 is mounted on the substrate 110 by, for example, reflow.

6-2. Dropping Step

Figure 8:
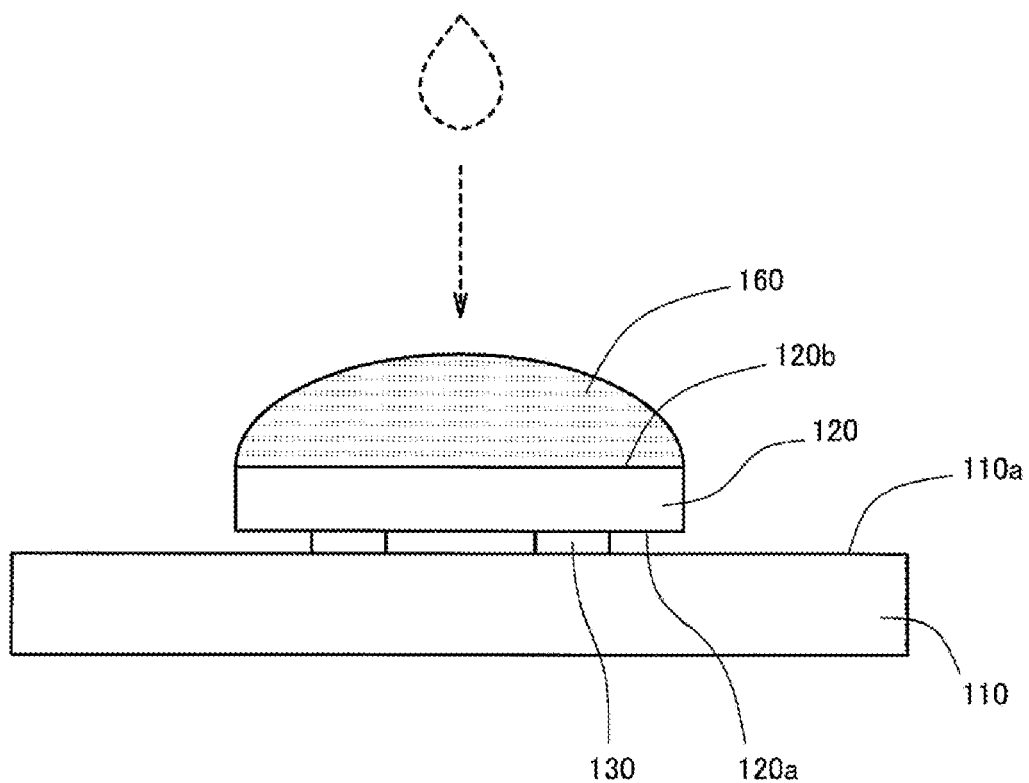
FIG. 8 is a diagram (part 2) illustrating the method for producing the light emitting device 100 according to the first embodiment.

As illustrated in FIG. 8, the fluorocarbon compound 160 is dropped onto the second surface 120b of the ultraviolet light emitting element 120. Accordingly, the fluorocarbon compound 160 spreads on the second surface 120b of the ultraviolet light emitting element 120. At this stage, the fluorocarbon compound 160 is not in contact with the side surface 120c of the ultraviolet light emitting element 120.

6-3. Lens Adhering Step

Figure 9:
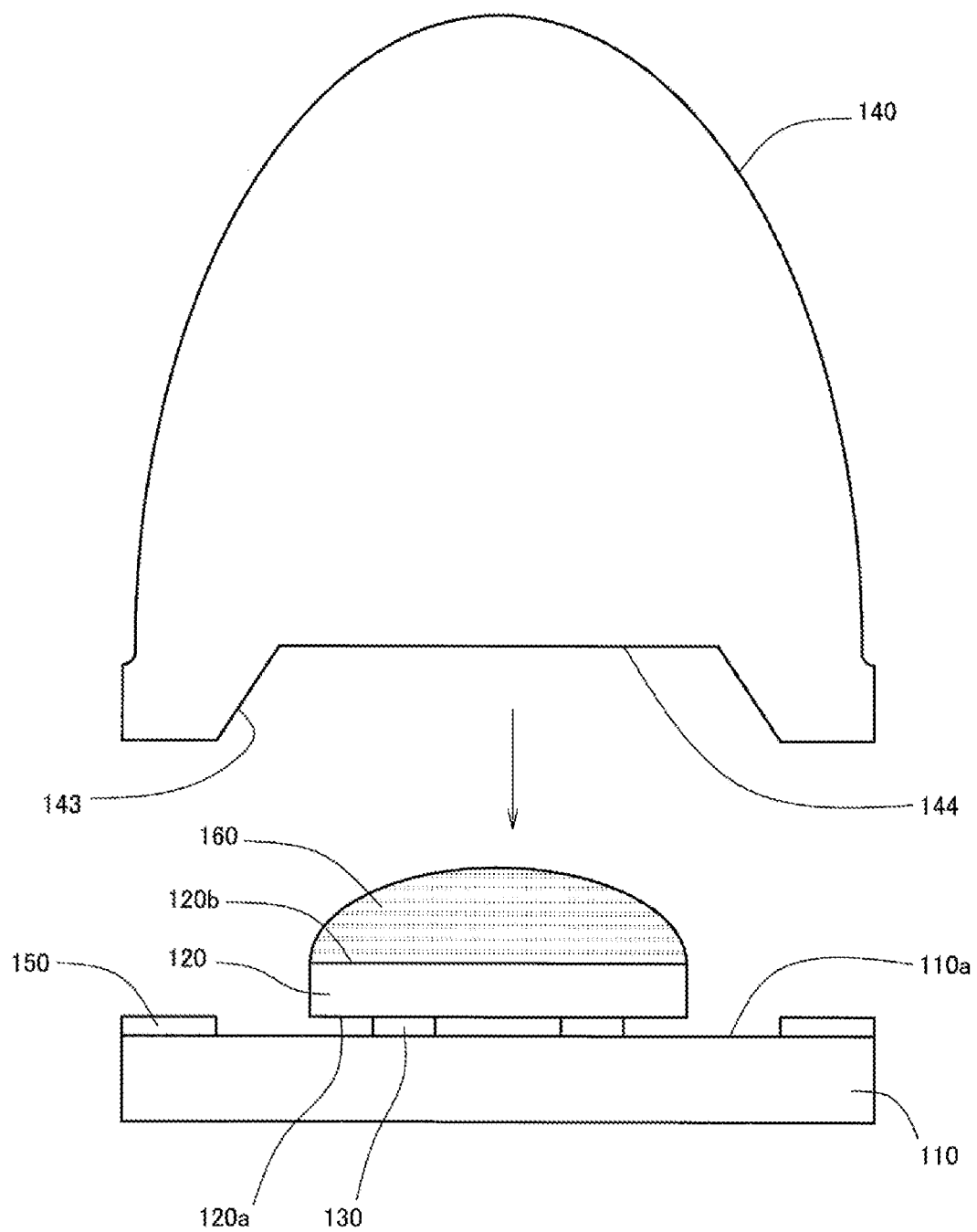
FIG. 9 is a diagram (part 3) illustrating a method for producing the light emitting device 100 according to the first embodiment.

As illustrated in FIG. 9, the adhesive layer 150 is coated onto the mounting surface 110a of the substrate 110. Thereafter, the lens 140 is adhered to the mounting surface 110a of the substrate 110. At this time, the ceiling surface 144 of the lens 140 presses the fluorocarbon compound 160. With this pressure, the fluorocarbon compound 160 spreads outward from above the second surface 120b of the ultraviolet light emitting element 120. Then, the fluorocarbon compound 160 spreads over the side surface 120c of the ultraviolet light emitting element 120 and also spreads over the inner wall 143 of the lens 140. Accordingly, the light emitting device 100 is produced.

7. Effect of First Embodiment 7-1. Fluorocarbon Compound

The fluorocarbon compound 160 covers the second surface 120b and the side surface 120c of the ultraviolet light emitting element 120. Therefore, the light to be emitted to the outside from the second surface 120b and the side surface 120c of the ultraviolet light emitting element 120 is less likely to be totally reflected at the boundary surface with the fluorocarbon compound 160. That is, the light extraction efficiency on the second surface 120b and the side surface 120c of the ultraviolet light emitting element 120 is high.

7-2. Air Layer

When the annular portion 171 of the air layer 170 is present between the outer edge portion 162 of the fluorocarbon compound 160 and the mounting surface 110a of the substrate 110, the fluorocarbon compound 160 is not in contact with the adhesive layer 150.

Therefore, there is almost no possibility that the fluorocarbon compound 160 and the adhesive layer 150 react with each other. In addition, the fluorocarbon compound 160 is less likely to spill out to the outside of the light emitting device 100.

7-3. Distance Between Ultraviolet Light Emitting Element and Lens

The fluorocarbon compound 160 absorbs ultraviolet light to some extent. Therefore, the distance H1 between the second surface 120b of the ultraviolet light emitting element 120 and the ceiling surface 144 of the lens 140 is preferably small. As the distance H1 decreases, the ultraviolet light is not absorbed by the fluorocarbon compound 160, and the light output increases.

8. Modifications 8-1. Shape of Fillet

Figure 10:
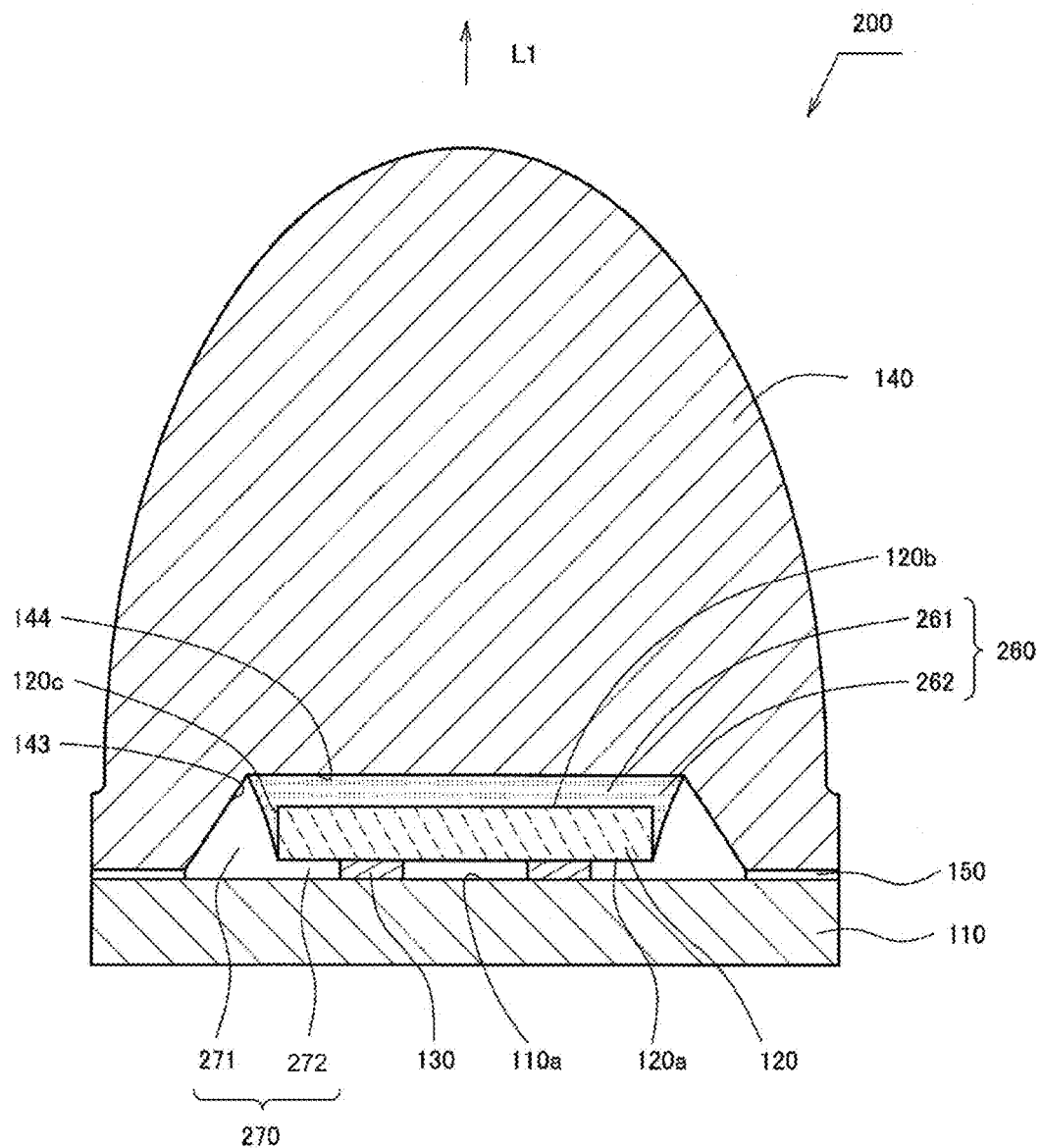
FIG. 10 is a schematic configuration diagram of a light emitting device 200 according to a modification of the first embodiment.

FIG. 10 is a schematic configuration diagram of a light emitting device 200 according to a modification of the first embodiment. In the light emitting device 200, a fluorocarbon compound 260 and an air layer 270 are different from those of the light emitting device 100. As illustrated in FIG. 10, the fluorocarbon compound 260 covers the side surface 120c of the ultraviolet light emitting element 120, but does not cover the inner wall 143 of the lens 140.

In this case, the light emitted from the second surface 120b of the ultraviolet light emitting element 120 is emitted without being reflected so much at an interface between the ultraviolet light emitting element 120 and the fluorocarbon compound 260. This is because a difference between the refractive index of the ultraviolet light emitting element 120 and a refractive index of the fluorocarbon compound 260 is small.

Similarly, the light emitted from the side surface 120c of the ultraviolet light emitting element 120 is not reflected so much at the interface between the ultraviolet light emitting element 120 and the fluorocarbon compound 260. That is, a large amount of light is incident on the fluorocarbon compound 260 from the ultraviolet light emitting element 120. The light is incident on the air layer 270 from the fluorocarbon compound 260, and the refractive index of the fluorocarbon compound 260 is a value between the refractive index of the ultraviolet light emitting element 120 and a refractive index of the air layer 270. Therefore, the amount of light incident on the air layer 270 from the fluorocarbon compound 260 is larger than that in the case where light is directly incident on the air layer from the ultraviolet light emitting element 120.

Figure 11:
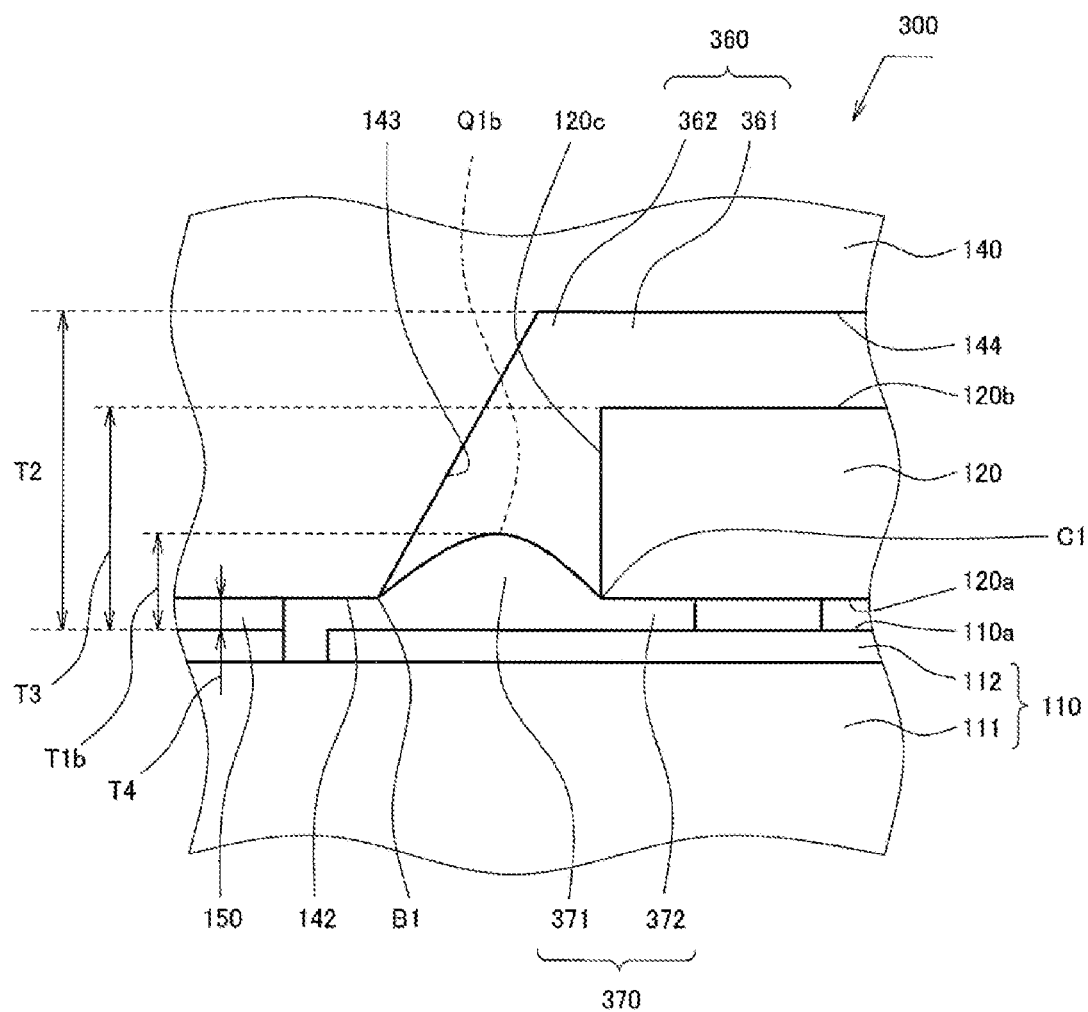
FIG. 11 is a schematic configuration diagram of a light emitting device 300 according to a modification of the first embodiment.

FIG. 11 is a schematic configuration diagram of a light emitting device 300 according to a modification of the first embodiment. In the light emitting device 300, a fluorocarbon compound 360 and an air layer 370 are different from those of the light emitting device 100. As illustrated in FIG. 11, a distance T1b is smaller than the distances T2 and T3 and larger than the distance T4. The distance T1b is a distance from a point Q1b in the air layer 370 located farthest from the mounting surface 110a of the substrate 110 to the mounting surface 110a of the substrate 110.

Thus, even when the amount of the fluorocarbon compound 360 is large, a portion of the fluorocarbon compound 360 which is located closest to the mounting surface 110a of the substrate 110 is located at a position (point B1) closest to the mounting surface 110a among points on the inner wall 143 of the lens 140, or at a position (point C1) closest to the mounting surface 110a among points on the side surface 120c of the ultraviolet light emitting element 120.

8-2. Filler

The fluorocarbon compound 160 may contain a filler which transmits ultraviolet light. The material of the filler is, for example, fluorine powder or silica. The filler may have a refractive index about the same as the refractive index of the fluorocarbon compound 160. The refractive index of the filler is, for example, 1.2 or more and 1.6 or less. The filler has a particle diameter of, for example, 20 nm or more and 50 μm or less. An abundance ratio of the filler in the fluorocarbon compound 160 is, for example, 0.1 wt % or more and 50 wt % or less.

When the filler is a material which does not contain fluorine, such as silica, the filler may absorb ultraviolet light. In this case, the particle diameter of the filler may be smaller than a peak value of the emission wavelength of the ultraviolet light emitting element 120. The filler has a particle diameter of, for example, 20 nm or more and 100 nm or less. The filler is preferably used for adjusting a static viscosity and a kinematic viscosity of the fluorocarbon compound 160. That is, it is preferable that the kinematic viscosity is low so as to facilitate the dropping during the dropping, and the static viscosity is high such that the shape of the fillet is not easily deformed after the fillet is formed.

8-3. Shape of Lens

Figure 12:
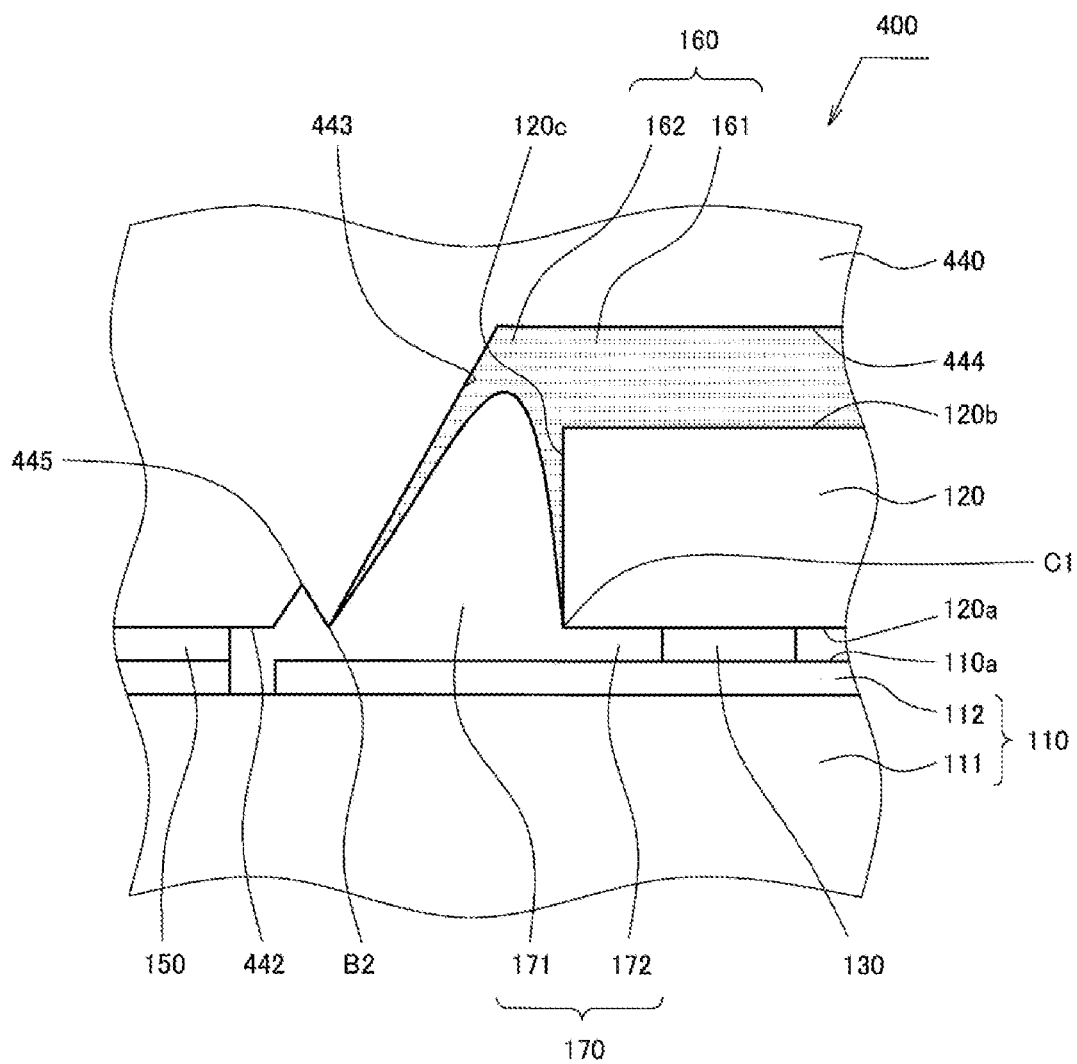
FIG. 12 is a diagram illustrating a lens 440 of an light emitting device 400 according to a modification of the first embodiment.

FIG. 12 is a diagram illustrating a lens 440 of an light emitting device 400 according to a modification of the first embodiment. As illustrated in FIG. 12, a concave portion 445 is present between an inner wall 443 of the lens 440 and a flat surface 442 of the lens 440. The concave portion 445 is concave from the flat surface 442 or the inner wall 443 toward the lens 440. The concave portion 445 is located between the fluorocarbon compound 160 and the adhesive layer 150. Therefore, the fluorocarbon compound 160 remains at a position of an end portion B2 of the concave portion 445 due to surface tension. That is, the fluorocarbon compound 160 is less likely to come into contact with the adhesive layer 150.

Figure 13:
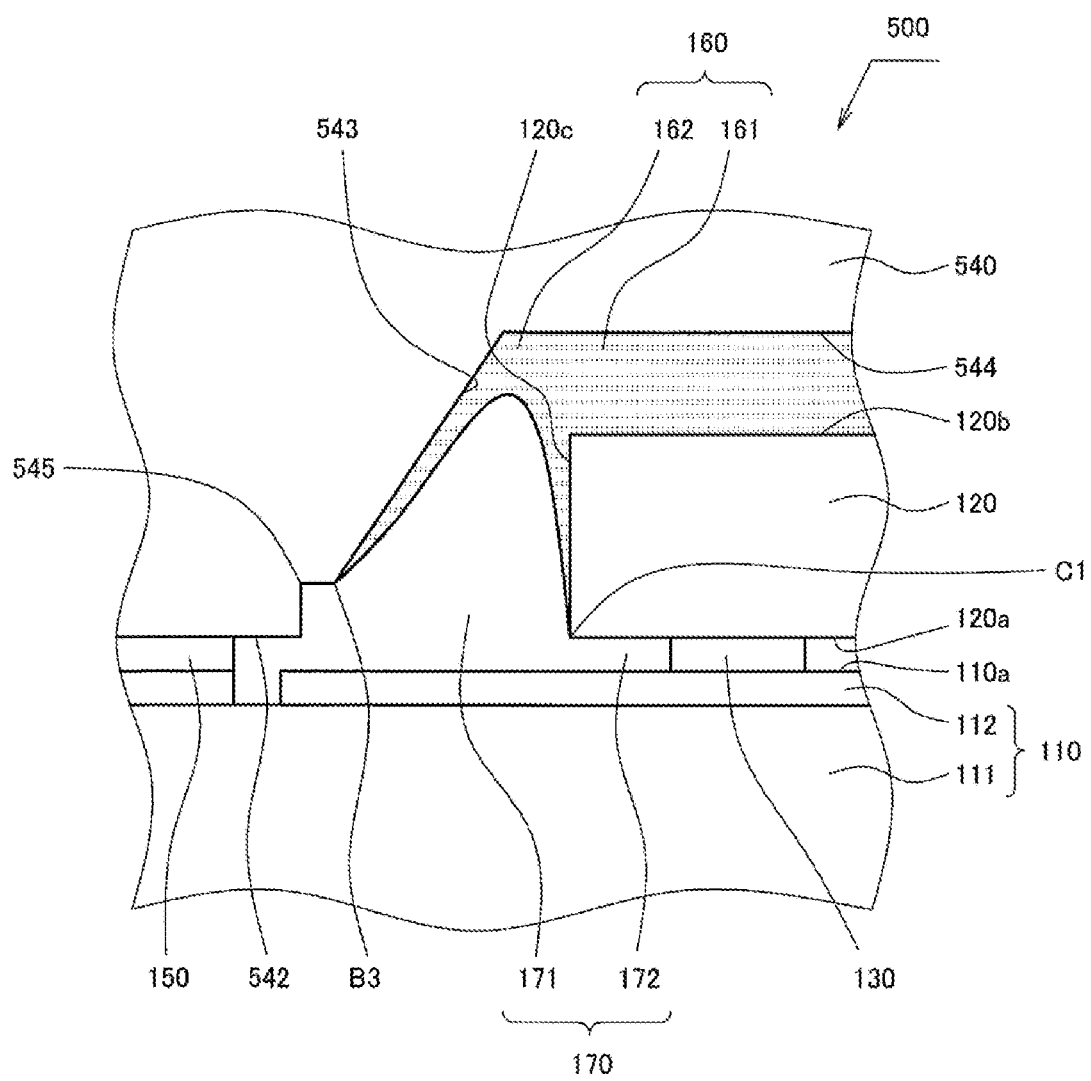
FIG. 13 is a diagram illustrating a lens 540 of an light emitting device 500 according to a modification of the first embodiment.

FIG. 13 is a diagram illustrating a lens 540 of an light emitting device 500 according to a modification of the first embodiment. As illustrated in FIG. 13, a concave portion 545 is present between an inner wall 543 of the lens 540 and a flat surface 542 of the lens 540. The concave portion 545 is concave from the flat surface 542 or the inner wall 543 toward the lens 540. The concave portion 545 is located between the fluorocarbon compound 160 and the adhesive layer 150. Therefore, the fluorocarbon compound 160 remains at a position of an end portion B3 of the concave portion 545 due to surface tension. That is, the fluorocarbon compound 160 is less likely to come into contact with the adhesive layer 150.

8-4. Shape of Air Layer

Figure 14:
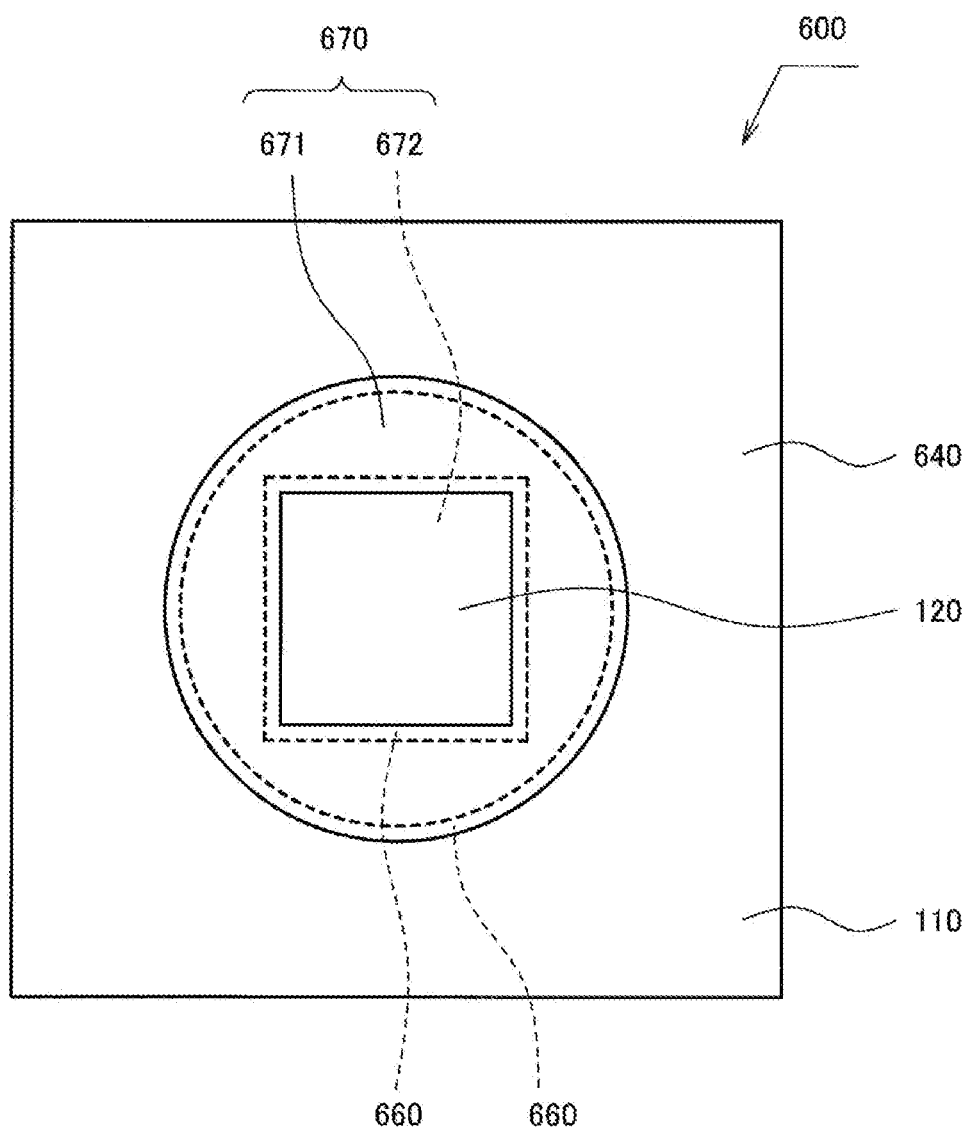
FIG. 14 is a diagram illustrating a region of an air layer 670 of an light emitting device 600 according to a modification of the first embodiment.

FIG. 14 is a diagram illustrating a region of an air layer 670 of an light emitting device 600 according to a modification of the first embodiment. In FIG. 14, to fluorocarbon compound 660 around the periphery of the ultraviolet light emitting element 120 is virtually drawn. The air layer 670 surrounds the periphery of the ultraviolet light emitting element 120 with the fluorocarbon compound 660 sandwiched therebetween. An outer edge of the air layer 670 on the side opposite to the ultraviolet light emitting element 120 has a circular shape. An outer edge of the air layer 670 depends on the shape of the inner wall of the lens. The outer edge of the air layer 670 may have another shape.

8-5. Ceiling Surface

The ceiling surface 144 is a plane parallel to the mounting surface 110a of the substrate 110. However, the ceiling surface 144 may not be parallel to the mounting surface 110a of the substrate 110. The ceiling surface 144 may be a curved surface.

8-6. Combination

The above modifications may be freely combined.

Second Embodiment

A second embodiment will be described. Points different from the first embodiment will be mainly described.

1. Light Emitting Device

Figure 15:
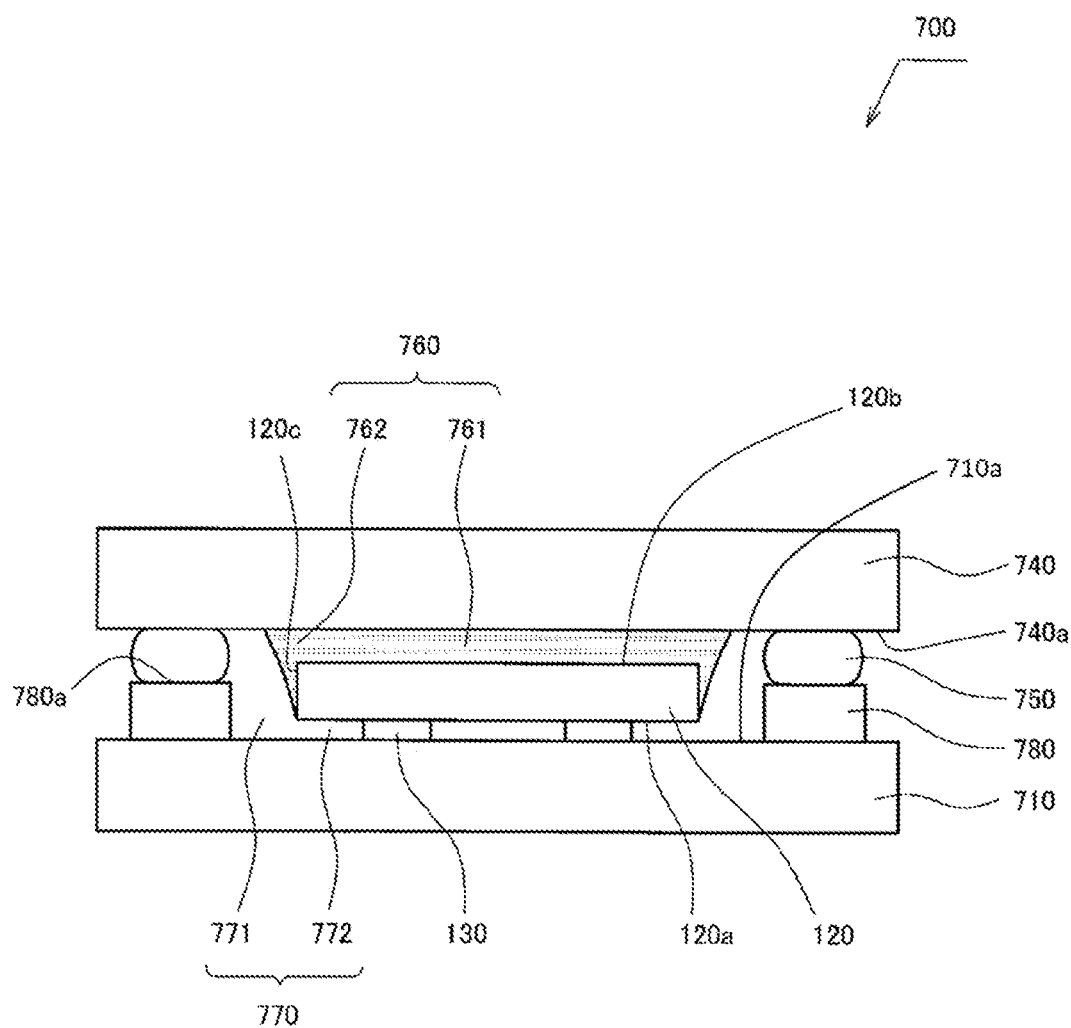
FIG. 15 is a schematic configuration diagram of a light emitting device 700 according to a second embodiment.

FIG. 15 is a schematic configuration diagram of a light emitting device 700 according to the second embodiment. As illustrated in FIG. 15, the light emitting device 700 includes a substrate 710, the ultraviolet light emitting element 120, the bonding layer 130, a glass 740, an adhesive layer 750, a fluorocarbon compound 760, and an air layer 770.

The substrate 710 has a wall 780.

The glass 740 is a light transmitting member which transmits ultraviolet light. The glass 740 has a flat plate shape. The glass 740 has a flat surface on a substrate 710 side.

The adhesive layer 750 adheres the wall 780 of the substrate 710 to the glass 740. The adhesive layer 750 adheres the wall 780 of the substrate 710 to the flat surface of the glass 740 on the substrate 710 side. The material of the adhesive layer 750 is, for example, a silicone resin.

The wall 780 is formed on a mounting surface 710a of the substrate 710. The wall 780 surrounds four sides of the ultraviolet light emitting element 120. The wall 780 is for partitioning individual ultraviolet light emitting elements 120. The wall 780 surrounds the periphery of the ultraviolet light emitting element 120 in a manner not in contact with the ultraviolet light emitting element 120. The material of the wall 780 is, for example, copper or AlN. The material of the wall 780 may be a material that does not easily absorb ultraviolet light.

2. Fluorocarbon Compound

The fluorocarbon compound 760 forms a fillet shape. Therefore, the fluorocarbon compound 760 is in contact with the side surface 120c of the ultraviolet light emitting element 120 and a ceiling surface 740a of the glass 740. However, the fluorocarbon compound 760 is not in contact with the mounting surface 710a of the substrate 710.

In addition, the fluorocarbon compound 760 covers the second surface 120b and the side surface 120c of the ultraviolet light emitting element 120, but does not cover the first surface 120a. Therefore, the fluorocarbon compound 760 does not cover the bonding layer 130. The fluorocarbon compound 760 is not in contact with the wall 780 and the adhesive layer 750.

The fluorocarbon compound 760 includes a central portion 761 and an outer edge portion 762. The central portion 761 is a region sandwiched between the ultraviolet light emitting element 120 and the glass 740. The central portion 761 has a rectangular parallelepiped shape. Vertical and horizontal lengths of the rectangular parallelepiped shape are equal to vertical and horizontal lengths of the ultraviolet light emitting element 120.

The outer edge portion 762 is a region sandwiched between the glass 740 and the air layer 770. The outer edge portion 762 is in contact with the side surface 120c of the ultraviolet light emitting element 120 and the ceiling surface 740a of the glass 740. Therefore, in a region immediately outside the ultraviolet light emitting element 120, the substrate 710, an annular portion 771 of the air layer 770, the outer edge portion 762 of the fluorocarbon compound 760, and the glass 740 are stacked in this order.

In the central portion 761, the fluorocarbon compound 760 fills a gap between the second surface 120b of the ultraviolet light emitting element 120 and the ceiling surface 740a of the glass 740.

3. Air Layer

The air layer 770 includes the annular portion 771 annularly surrounding the periphery of the ultraviolet light emitting element 120, and a coupling portion 772, which is a gap between the ultraviolet light emitting element 120 and the substrate 710. The annular portion 771 is an annular space based on a quadrangle conforming to the shape of the ultraviolet light emitting element 120. The coupling portion 772 is a gap that couples to the annular portion 771.

The annular portion 771 is located between the mounting surface 710a of the substrate 710 and the outer edge portion 762 of the fluorocarbon compound 760. The annular portion 771 surrounds the periphery of the side surface 120c of the ultraviolet light emitting element 120. The fluorocarbon compound 760 is present between the annular portion 771 and the side surface 120c of the ultraviolet light emitting element 120.

4. Height of Wall

The wall 780 has an upper surface 780a. The upper surface 780a is located on a side of the wall 780 opposite to the substrate 710. A height of the wall 780 is a distance from the mounting surface 710a of the substrate 710 to the upper surface 780a of the wall 780. The distance from the mounting surface 710a of the substrate 710 to the upper surface 780a of the wall 780 is smaller than a distance from the mounting surface 710a of the substrate 710 to the second surface 120b of the ultraviolet light emitting element 120.

A thickness of the central portion 761 of the fluorocarbon compound 760 is smaller than a thickness of the adhesive layer 750.

5. Method for Producing Light Emitting Device 5-1. Element Mounting Step

The ultraviolet light emitting element 120 is mounted on the mounting surface 710a of the substrate 710.

5-2. Wall Forming Step

The wall 780 is formed around the periphery of the ultraviolet light emitting element 120.

5-3. Dropping Step

The fluorocarbon compound 760 is dropped onto the second surface 120b of the ultraviolet light emitting element 120.

5-4. Adhering Step

The adhesive layer 750 is coated onto the upper surface 780a of the wall 780, and the glass 740 is adhered thereto.

At this time, the fluorocarbon compound 760 is pressed and spread.

6. Effect of Second Embodiment 6-1. Fluorocarbon Compound

The fluorocarbon compound 760 covers the second surface 120b and the side surface 120c of the ultraviolet light emitting element 120. Therefore, the light to be emitted to the outside from the second surface 120b and the side surface 120c of the ultraviolet light emitting element 120 is less likely to be totally reflected at the boundary surface with the fluorocarbon compound 760. That is, the light extraction efficiency on the second surface 120b and the side surface 120c of the ultraviolet light emitting element 120 is high.

6-2. Air Layer

When the annular portion 771 of the air layer 770 is present between the outer edge portion 762 of the fluorocarbon compound 760 and the mounting surface 710a of the substrate 710, the fluorocarbon compound 760 is not in contact with the adhesive layer 750. Therefore, there is almost no possibility that the fluorocarbon compound 760 and the adhesive layer 750 react with each other. In addition, the fluorocarbon compound 760 is less likely to spill out to the outside of the light emitting device 700.

7. Modifications 7-1. Fluorocarbon Compound

Figure 16:
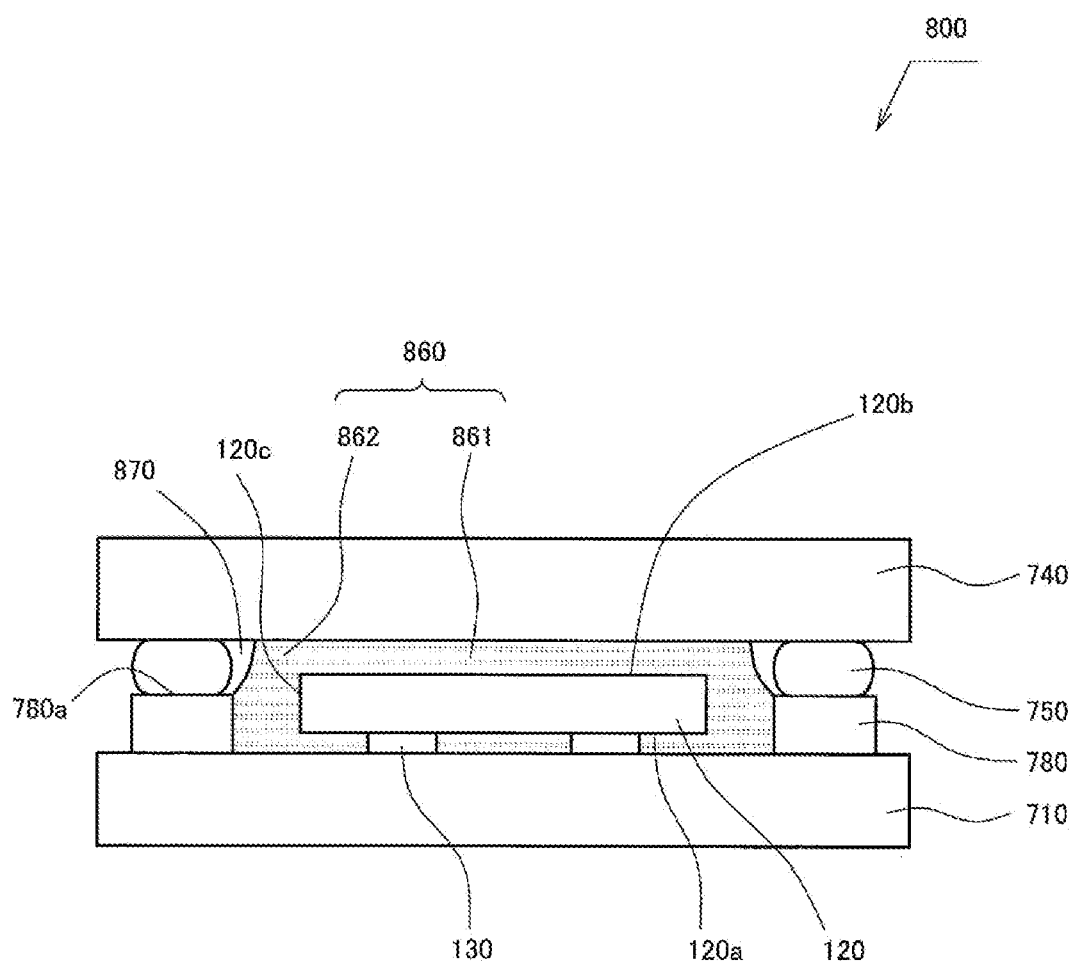
FIG. 16 is a schematic configuration diagram of a light emitting device 800 according to a modification of the second embodiment.

FIG. 16 is a schematic configuration diagram of a light emitting device 800 according to a modification of the second embodiment. As illustrated in FIG. 16, in the light emitting device 800, a fluorocarbon compound 860 is in contact with and covers the mounting surface 710a of the substrate 710. An air layer 870 is formed from an end portion of the upper surface 780a of the wall 780 to the ceiling surface 740a of the glass 740. The fluorocarbon compound 860 is not in contact with the adhesive layer 750.

7-2. Wall

Figure 17:
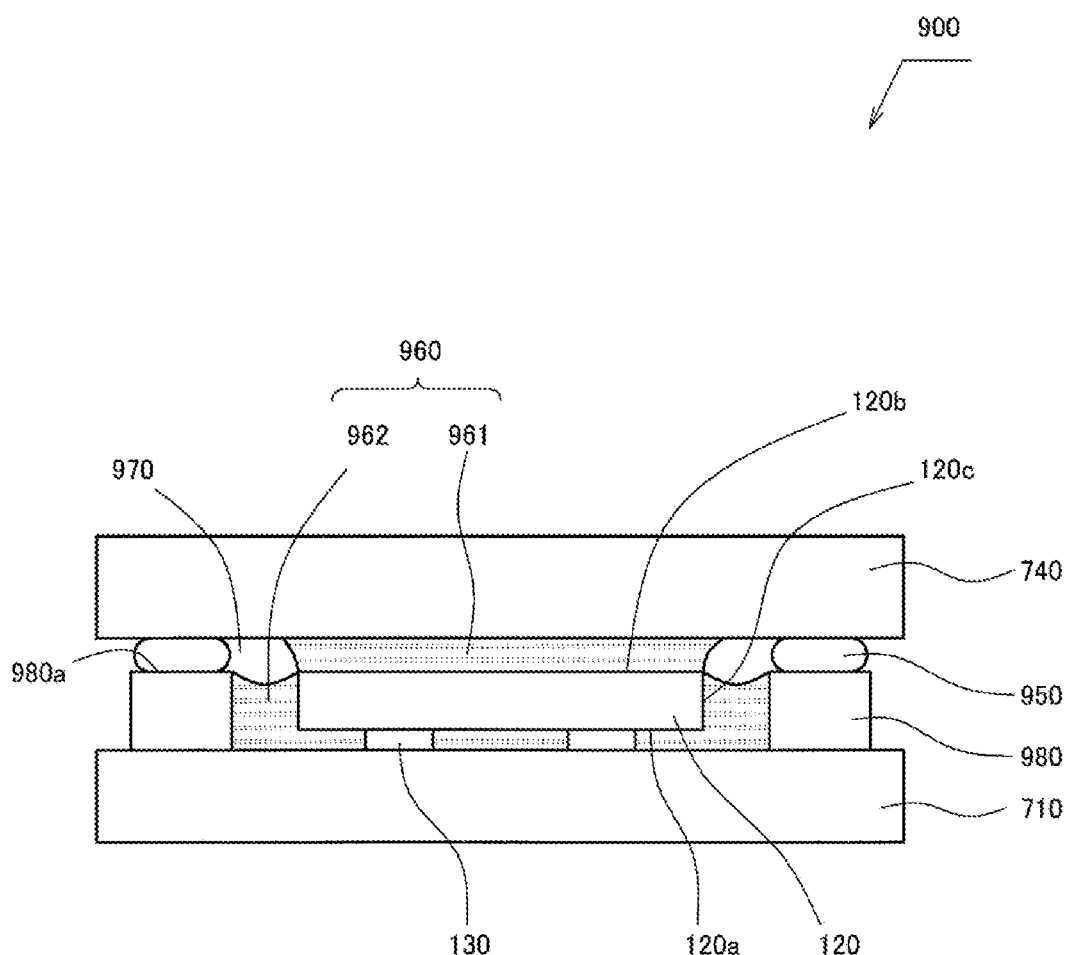
FIG. 17 is a schematic configuration diagram of a light emitting device 900 according to a modification of the second embodiment.

FIG. 17 is a schematic configuration diagram of a light emitting device 900 according to a modification of the second embodiment. As illustrated in FIG. 17, a height of an upper surface 980a of a wall 980 from the substrate 710 is larger than the height of the second surface 120b of the ultraviolet light emitting element 120 from the substrate 710.

In the light emitting device 900, a fluorocarbon compound 960 is in contact with and covers the mounting surface of the substrate 710. The fluorocarbon compound 960 includes a central portion 961 and an outer edge portion 962. The central portion 961 and the outer edge portion 962 are separated from each other.

The central portion 961 is located between the second surface 120b of the ultraviolet light emitting element 120 and the ceiling surface 740a of the glass 740. The outer edge portion 962 fills a gap between the wall 980 and the ultraviolet light emitting element 120. The outer edge portion 962 is filled up to the second surface 120b of the ultraviolet light emitting element 120 or the upper surface 980a of the wall 980. The fluorocarbon compound 960 is not in contact with an adhesive layer 950.

7-3. Counterbore

Figure 18:
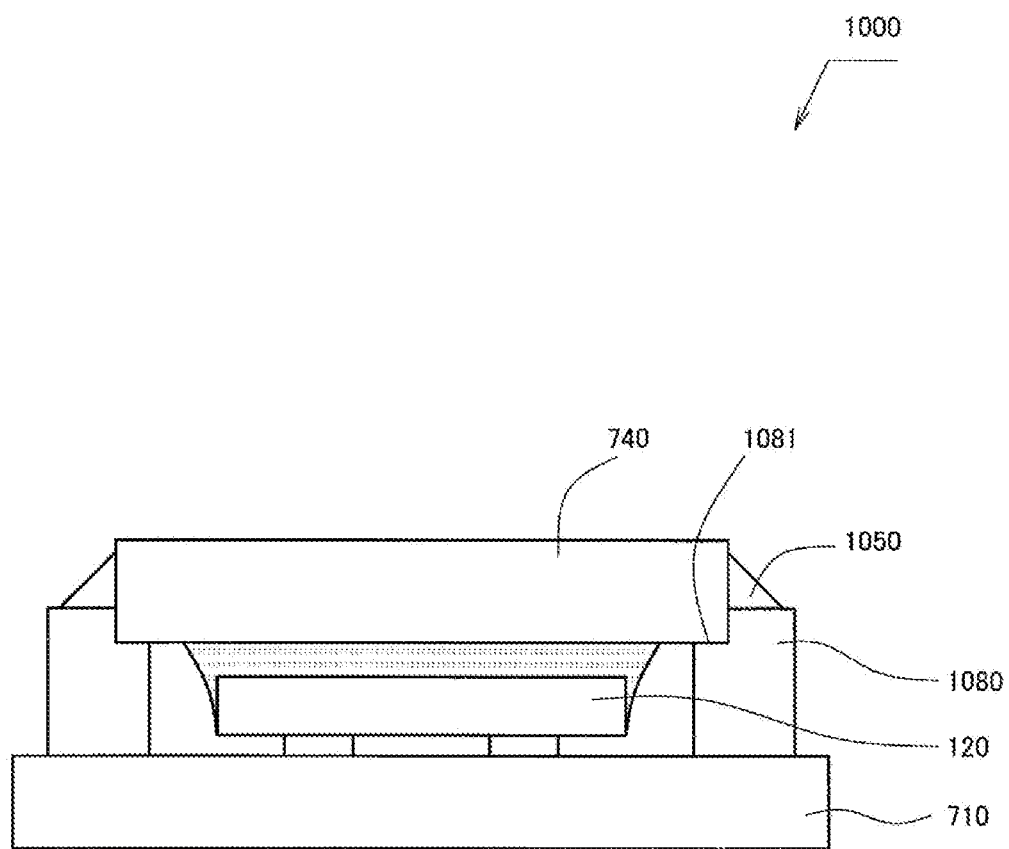
FIG. 18 is a schematic configuration diagram of a light emitting device 1000 according to a modification of the second embodiment.

FIG. 18 is a schematic configuration diagram of a light emitting device 1000 according to a modification of the second embodiment. As illustrated in FIG. 18, a wall 1080 has a counterbore 1081. The glass 740 is placed on the counterbore 1081. The wall 1080 and the glass 740 are adhered to each other via an adhesive layer 1050.

7-4. Glass

A light transmitting member other than the flat plate-shaped glass may be used. The light transmitting member may be, for example, a member having a flat surface on a lower surface and a convex lens opposite to the lower surface. Even in this case, the light transmitting member has a flat surface on the substrate 710 side. The flat surface is adhered to the wall via an adhesive layer.

7-5. Combination

The above modifications may be freely combined.

Combination of Embodiments

The modifications of the first embodiment and the second embodiment may be combined.

(Evaluation Test)

1. Sample

An experiment was conducted on a light emitting device having a lens. The brightness of the light emitting device was evaluated by changing the region of the fluorocarbon compound inside the light emitting device. The same applies to all samples except for the region of the fluorocarbon compound.

2. Experiment Results

Figure 19:
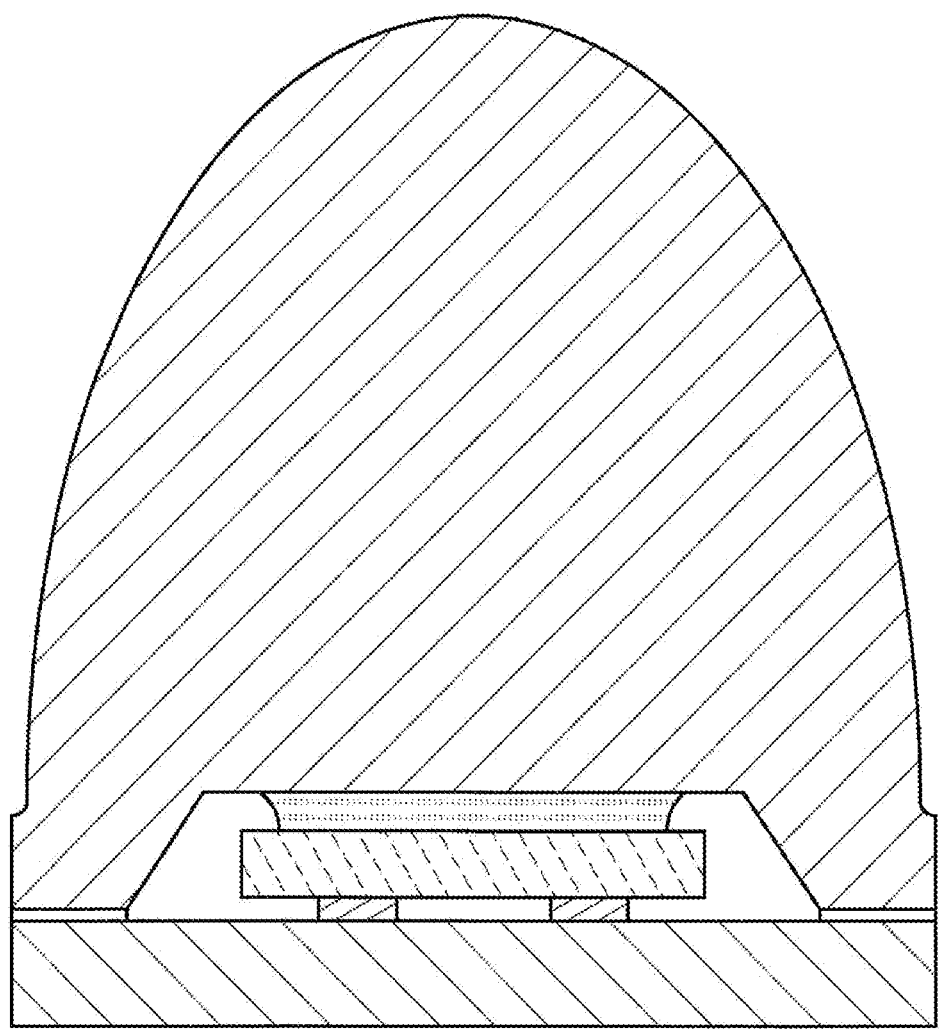
FIG. 19 is a diagram illustrating a sample of Comparative Example 2 in an evaluation test.

Table 1 summarizes the experiment results. Example 1 corresponds to the first embodiment. Comparative Example 1 is a sample containing no fluorocarbon compound. As illustrated in FIG. 19, Comparative Example 2 is a sample in which the fluorocarbon compound is filled only between the ultraviolet light emitting element and the ceiling surface of the lens. Comparative Example 3 is a sample in which the gap between the substrate and the lens is filled with the fluorocarbon compound and the air layer is not provided.

The brightness of Comparative Example 1 was normalized as 1.

As shown in Table 1, Example 1 has high brightness and excellent adhesion. In Comparative Examples 1 and 2, the adhesion is sufficient, but the brightness is slightly weak. In Comparative Example 3, the brightness is the largest but the adhesion is insufficient. That is, peeling has occurred between the substrate and the lens.

TABLE 1

| Sample | Fluorocarbon compound | Brightness | Adhesion |
|---|---|---|---|
| Example 1 | FIG. 1 | 1.4 | ○ |
| Comparative Example 1 | No | 1 | ○ |
| Comparative Example 2 | FIG. 19 | 1.3 | ○ |
| Comparative Example 3 | Full filling | 1.5 | x |

APPENDIX

An ultraviolet light emitting device according to a first aspect includes a substrate, an ultraviolet light emitting element, a bonding layer, a light transmitting member, an adhesive layer, and a fluorocarbon compound. The substrate has a mounting surface for mounting the ultraviolet light emitting element. The ultraviolet light emitting element has a first surface having an electrode, a second surface opposite to the first surface, and a side surface. The bonding layer bonds the electrode on the first surface of the ultraviolet light emitting element and a part of the mounting surface of the substrate. The light transmitting member is configured to transmit ultraviolet light. The adhesive layer adheres the substrate to the light transmitting member. The substrate and the light transmitting member are disposed in a state where the ultraviolet light emitting element is sandwiched therebetween. The fluorocarbon compound is a liquid at normal temperature and pressure. The fluorocarbon compound fills a gap between the second surface of the ultraviolet light emitting element and the light transmitting member in a state of being in contact with the second surface and the light transmitting member. The fluorocarbon compound is in contact with the side surface of the ultraviolet light emitting element. The fluorocarbon compound is not in contact with the adhesive layer.

An ultraviolet light emitting device according to a second aspect further includes an air layer. The air layer is located between the substrate and the light transmitting member. The air layer is in contact with the fluorocarbon compound and the adhesive layer.

In an ultraviolet light emitting device according to a third aspect, the air layer surrounds a periphery of the ultraviolet light emitting element. The fluorocarbon compound is present between the air layer and the ultraviolet light emitting element.

In an ultraviolet light emitting device according to a fourth aspect, a distance from a point in the air layer located farthest from the mounting surface of the substrate to the mounting surface of the substrate is larger than a distance from the second surface of the ultraviolet light emitting element to the mounting surface of the substrate.

In an ultraviolet light emitting device according to a fifth aspect, a distance from a point in the air layer located farthest from the mounting surface of the substrate to the mounting surface of the substrate is smaller than a distance from the second surface of the ultraviolet light emitting element to the mounting surface of the substrate.

In an ultraviolet light emitting device according to a sixth aspect, the fluorocarbon compound is not in contact with the mounting surface of the substrate.

In an ultraviolet light emitting device according to a seventh aspect, the fluorocarbon compound is not in contact with the bonding layer.

In an ultraviolet light emitting device according to an eighth aspect, a thickness of the fluorocarbon compound in contact with the side surface of the ultraviolet light emitting element increases as a distance from the mounting surface of the substrate increases.

In an ultraviolet light emitting device according to a ninth aspect, the fluorocarbon compound contains a filler configured to transmit ultraviolet light. The filler has a refractive index of 1.2 or more and 1.6 or less.

In an ultraviolet light emitting device according to a tenth aspect, the filler is a material which does not contain fluorine. A particle diameter of the filler is smaller than a peak value of an emission wavelength of the ultraviolet light emitting element.

In an ultraviolet light emitting device according to an eleventh aspect, the light transmitting member is a lens. A concave portion is formed in the lens on a mounting surface side of the substrate. The concave portion has a ceiling surface and an inner wall.

In an ultraviolet light emitting device according to a twelfth aspect, the fluorocarbon compound is present on the inner wall.

In an ultraviolet light emitting device according to a thirteenth aspect, a distance between the second surface of the ultraviolet light emitting element and the ceiling surface of the lens is 0.1 µm or more and 500 µm or less.

In an ultraviolet light emitting device according to a fourteenth aspect, the substrate has a wall surrounding the periphery of the ultraviolet light emitting element in a manner not in contact with the ultraviolet light emitting element. the light transmitting member has a flat surface on a substrate side. The adhesive layer adheres the wall of the substrate to the flat surface of the light transmitting member. A height of the wall from the mounting surface is smaller than a height of the second surface of the ultraviolet light emitting element from the mounting surface.

What is claimed is:

1. An ultraviolet light emitting device, comprising:
   a substrate;
   an ultraviolet light emitting element;
   a bonding layer;
   a light transmitting member;
   an adhesive layer; and
   a fluorocarbon compound,
   wherein:
   the substrate has a mounting surface mounting the ultraviolet light emitting element;
   the ultraviolet light emitting element has a first surface having an electrode, a second surface opposite to the first surface, and a side surface;
   the bonding layer bonds the electrode on the first surface of the ultraviolet light emitting element and a part of the mounting surface of the substrate;
   the light transmitting member is configured to transmit ultraviolet light;
   the adhesive layer adheres the substrate directly to the light transmitting member;
   the substrate and the light transmitting member are disposed in a state where the ultraviolet light emitting element is sandwiched therebetween;
   the fluorocarbon compound is a liquid at normal temperature and pressure;
   the fluorocarbon compound fills a gap between the second surface of the ultraviolet light emitting element and the light transmitting member in a state of being in contact with the second surface and the light transmitting member;
   the fluorocarbon compound is in contact with the side surface of the ultraviolet light emitting element;
   the fluorocarbon compound is not in contact with the adhesive layer; and
   a surface of the light transmitting member and the second surface of the ultraviolet light emitting element are coplanar.

2. The ultraviolet light emitting device according to claim 1, further comprising:
   an air layer, wherein:
   the air layer is located between the substrate and the light transmitting member; and
   the air layer is in contact with the fluorocarbon compound and the adhesive layer.

3. The ultraviolet light emitting device according to claim 2, wherein:
   the air layer surrounds a periphery of the ultraviolet light emitting element; and
   the fluorocarbon compound is present between the air layer and the ultraviolet light emitting element.

4. The ultraviolet light emitting device according to claim 2, wherein:

a distance from a point in the air layer located farthest from the mounting surface of the substrate to the mounting surface of the substrate is larger than a distance from the second surface of the ultraviolet light emitting element to the mounting surface of the substrate.

5. The ultraviolet light emitting device according to claim 2, wherein:
a distance from a point in the air layer located farthest from the mounting surface of the substrate to the mounting surface of the substrate is smaller than a distance from the second surface of the ultraviolet light emitting element to the mounting surface of the substrate.

6. The ultraviolet light emitting device according to claim 1, wherein:
the fluorocarbon compound is not in contact with the mounting surface of the substrate.

7. The ultraviolet light emitting device according to claim 1, wherein:
the fluorocarbon compound is not in contact with the bonding layer.

8. The ultraviolet light emitting device according to claim 1, wherein:
a thickness of the fluorocarbon compound in contact with the side surface of the ultraviolet light emitting element increases as a distance from the mounting surface of the substrate increases.

9. The ultraviolet light emitting device according to claim 1, wherein:
the fluorocarbon compound contains a filler configured to transmit ultraviolet light; and
the filler has a refractive index of 1.2 or more and 1.6 or less.

10. The ultraviolet light emitting device according to claim 9, wherein:
the filler is a material which does not contain fluorine; and
a particle diameter of the filler is smaller than a peak value of an emission wavelength of the ultraviolet light emitting element.

11. The ultraviolet light emitting device according to claim 1, wherein:
the light transmitting member is a lens;
a concave portion is formed in the lens on the mounting surface side of the substrate; and
the concave portion has a ceiling surface and an inner wall.

12. The ultraviolet light emitting device according to claim 11, wherein:
the fluorocarbon compound is present on the inner wall.

13. The ultraviolet light emitting device according to claim 11, wherein:
a distance between the second surface of the ultraviolet light emitting element and the ceiling surface of the lens is 0.1 µm or more and 500 µm or less.

14. The ultraviolet light emitting device according to claim 1, wherein:
the substrate has a wall surrounding a periphery of the ultraviolet light emitting element in a manner not in contact with the ultraviolet light emitting element;
the light transmitting member has a flat surface on a substrate side;
the adhesive layer adheres the wall of the substrate to the flat surface of the light transmitting member; and
a height of the wall from the mounting surface is smaller than a height of the second surface of the ultraviolet light emitting element from the mounting surface.

15. The ultraviolet light emitting device according to claim 1, wherein the light transmitting member includes a ceiling surface that faces the substrate and the ultraviolet light emitting element after the light transmitting member is bonded to the substrate.

16. An ultraviolet light emitting device, comprising:
a substrate;
an ultraviolet light emitting element;
a bonding layer;
a light transmitting member;
an adhesive layer; and
a fluorocarbon compound,
wherein:
the substrate has a mounting surface mounting the ultraviolet light emitting element;
the ultraviolet light emitting element has a first surface having an electrode, a second surface opposite to the first surface, and a side surface;
the bonding layer bonds the electrode on the first surface of the ultraviolet light emitting element and a part of the mounting surface of the substrate;
the light transmitting member is configured to transmit ultraviolet light;
the adhesive layer adheres the substrate directly to the light transmitting member;
the substrate and the light transmitting member are disposed in a state where the ultraviolet light emitting element is sandwiched therebetween;
the fluorocarbon compound is a liquid at normal temperature and pressure;
the fluorocarbon compound fills a gap between the second surface of the ultraviolet light emitting element and the light transmitting member in a state of being in contact with the second surface and the light transmitting member;
the fluorocarbon compound is in contact with the side surface of the ultraviolet light emitting element;
the fluorocarbon compound is not in contact with the adhesive layer;
the light transmitting member includes a ceiling surface that faces the substrate and the ultraviolet light emitting element after the light transmitting member is bonded to the substrate; and
a distance from the ceiling surface of the light transmitting member to the adhesive layer is greater than a distance from the second surface of the ultraviolet light emitting element to the adhesive layer.

17. The ultraviolet light emitting device according to claim 16, wherein the light transmitting member includes:
a flat surface that contacts the adhesive layer; and
an inner wall surface extending at an angle downward from the ceiling surface to the flat surface.

18. The ultraviolet light emitting device according to claim 17, wherein the fluorocarbon compound contacts an entirety of the inner wall surface.

19. An ultraviolet light emitting device, comprising:
a substrate;
an ultraviolet light emitting element;
a bonding layer;
a light transmitting member;
an adhesive layer;
an air layer; and
a fluorocarbon compound,
wherein:
the substrate has a mounting surface mounting the ultraviolet light emitting element;

the ultraviolet light emitting element has a first surface having an electrode, a second surface opposite to the first surface, and a side surface;

the bonding layer bonds the electrode on the first surface of the ultraviolet light emitting element and a part of the mounting surface of the substrate;

the light transmitting member is configured to transmit ultraviolet light;

the adhesive layer adheres the substrate to the light transmitting member;

the substrate and the light transmitting member are disposed in a state where the ultraviolet light emitting element is sandwiched therebetween;

the fluorocarbon compound is a liquid at normal temperature and pressure;

the fluorocarbon compound fills a gap between the second surface of the ultraviolet light emitting element and the light transmitting member in a state of being in contact with the second surface and the light transmitting member;

the fluorocarbon compound is in contact with the side surface of the ultraviolet light emitting element;

the fluorocarbon compound is not in contact with the adhesive layer, the air layer is located between the substrate and the light transmitting member;

the air layer is in contact with the fluorocarbon compound and the adhesive layer; and a distance from a point in the air layer located farthest from the mounting surface of the substrate to the mounting surface of the substrate is smaller than a distance from the second surface of the ultraviolet light emitting element to the mounting surface of the substrate.

* * * * *